(12) United States Patent
Araoka

(10) Patent No.: US 11,049,964 B2
(45) Date of Patent: Jun. 29, 2021

(54) SILICON CARBIDE SEMICONDUCTOR DEVICE

(71) Applicant: FUJI ELECTRIC CO., LTD., Kawasaki (JP)

(72) Inventor: Tsuyoshi Araoka, Kohriyama (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/806,712

(22) Filed: Mar. 2, 2020

(65) Prior Publication Data

US 2020/0328301 A1 Oct. 15, 2020

(30) Foreign Application Priority Data

Apr. 15, 2019 (JP) .............................. JP2019-077328

(51) Int. Cl.
*H01L 29/78* (2006.01)
*H01L 29/16* (2006.01)
*H01L 29/423* (2006.01)
*H01L 29/06* (2006.01)

(52) U.S. Cl.
CPC ...... *H01L 29/7811* (2013.01); *H01L 29/0696* (2013.01); *H01L 29/1608* (2013.01); *H01L 29/4238* (2013.01); *H01L 29/7813* (2013.01)

(58) Field of Classification Search
CPC ............. H01L 29/7811; H01L 29/0696; H01L 29/1608; H01L 29/4238; H01L 29/7813; H01L 29/1095; H01L 29/7802
See application file for complete search history.

(56) References Cited

U.S. PATENT DOCUMENTS

| 2016/0020289 | A1 | 1/2016 | Nakano et al. | |
| 2018/0350900 | A1 | 12/2018 | Nakamata et al. | |
| 2019/0074373 | A1* | 3/2019 | Kobayashi | H01L 29/0623 |
| 2019/0181260 | A1* | 6/2019 | Maeta | H01L 29/0634 |
| 2019/0341308 | A1 | 11/2019 | Urakami et al. | |

FOREIGN PATENT DOCUMENTS

| JP | 2014-175314 A | 9/2014 |
| JP | 2019-117016 A | 7/2018 |
| JP | 2018-206873 A | 12/2018 |

* cited by examiner

*Primary Examiner* — Douglas W Owens
(74) *Attorney, Agent, or Firm* — Rabin & Berdo, P.C.

(57) ABSTRACT

A first portion of the poly-silicon layer is provided on a first face of a front surface of a semiconductor substrate via a gate insulating film in an edge termination region and configures a gate runner. The first portion opposes an edge $p^{++}$-type contact region in a depth direction Z. A chip-end-side edge of the first portion is positioned within a plane of the edge $p^{++}$-type contact region. A field oxide film disposed separated from the poly-silicon layer, extends from a chip end toward a chip center and, on the first face, terminates closer to the chip end than does the first portion. The entire surface of the poly-silicon layer is flat, free of a step due to the field oxide film. A chip-center-side edge of the field oxide film is closer to the chip end than is the edge $p^{++}$-type contact region and positioned on a p-type base region.

8 Claims, 16 Drawing Sheets

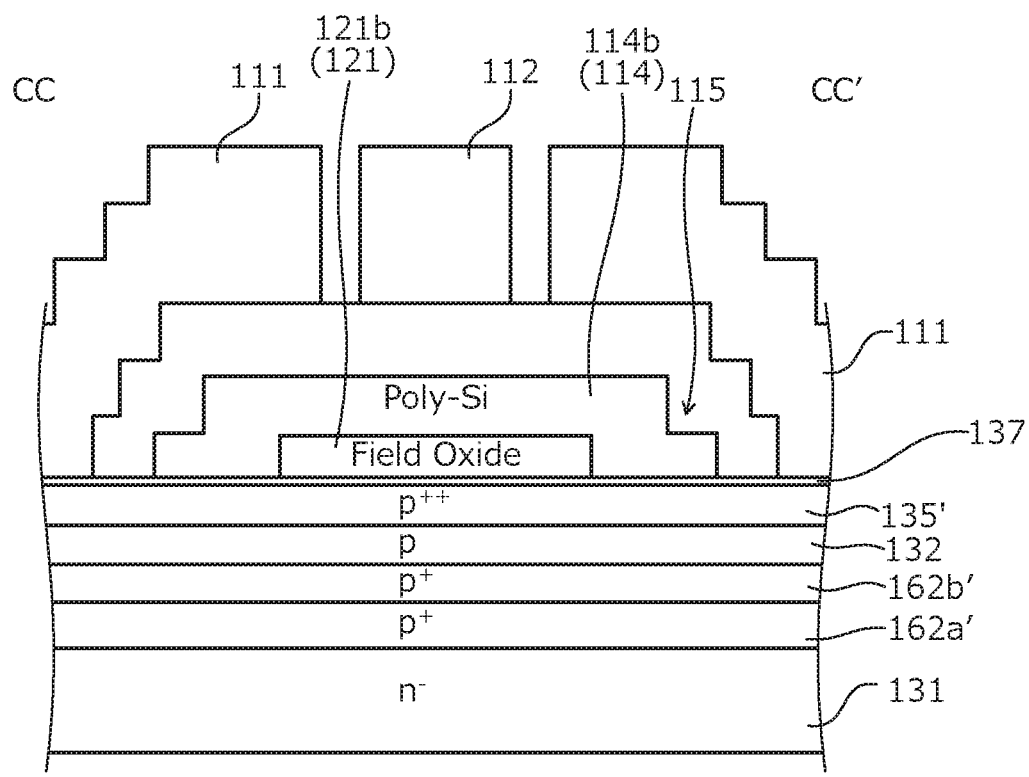

SILICON CARBIDE SEMICONDUCTOR DEVICE

CROSS REFERENCE TO RELATED APPLICATIONS

This application is based upon and claims the benefit of priority of the prior Japanese Patent Application No. 2019-077328, filed on Apr. 15, 2019, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, a trench-gate SiC-metal oxide semiconductor field effect transistor (MOSFET) containing silicon carbide (SiC) as a semiconductor material and having a 3-layer structure including a metal, an oxide film, and a semiconductor material has a structure in which directly beneath a gate metal layer of an edge termination region, a poly-silicon (poly-Si) layer configuring a gate runner extends on a field oxide film. A structure of an edge termination region of a conventional semiconductor device will be described.

FIG. 13 is a plan view of a layout when the conventional silicon carbide semiconductor device is viewed from a front surface of a semiconductor substrate. FIG. 14 is an enlarged plan view of a rectangular frame AA in FIG. 13. Among vertices of the rectangular frame AA in FIG. 13, a vertex AA1 nearest a corner of a semiconductor substrate 150 and a vertex AA2 nearest a center of the semiconductor substrate 150 are assumed as a pair of vertices. A region surrounded by the rectangular frame AA is a portion of an edge termination region 102 of the semiconductor substrate (semiconductor chip) 150. FIG. 15 is a cross-sectional view of a structure along cutting line BB-BB' in FIG. 14. FIG. 16 is a cross-sectional view of a structure along cutting line CC-CC' in FIG. 13.

A conventional silicon carbide semiconductor device 110 depicted in FIGS. 13 to 16 is a vertical MOSFET having a trench gate structure that includes a gate metal layer 113 and a poly-silicon layer 114 in the edge termination region 102 that surrounds a periphery of an active region 101. In the active region 101, on a front surface side of the semiconductor substrate 150, parts configuring a MOS gate structure are provided. In the active region 101, on a first face 153a described hereinafter of a front surface of the semiconductor substrate 150, a source pad 111 and a gate pad 112 are provided separated from each other. The source pad 111 has a substantially rectangular planar shape in which one portion is recessed.

The source pad 111 occupies most of a surface area of the active region 101 and extends from the active region 101 into the edge termination region 102. In FIG. 13, a perimeter 111a of the source pad 111 is indicated by finer broken line than is a field oxide film 121 described hereinafter. The gate pad 112 is disposed in the recessed portion of the source pad 111 and has a substantially rectangular planar shape surrounded on three sides by the source pad 111. A gate insulating film 137 extends on the front surface of the semiconductor substrate 150 in the edge termination region 102, from inner walls of trenches 136 configuring the MOS gate structure in the active region 101.

On the gate insulating film 137 on a second face 153b described hereinafter of the front surface of the semiconductor substrate 150, the field oxide film 121 is provided. The field oxide film 121 extends from an end (hereinafter, chip end) of the semiconductor substrate 150 toward the active region 101 (toward a chip center) and terminates on the first face 153a of the front surface of the semiconductor substrate 150 in the edge termination region 102. The field oxide film 121 is disposed on the first face 153a of the front surface of the semiconductor substrate 150, directly beneath the gate metal layer 113, directly beneath the gate pad 112, and directly beneath a metal layer (hereinafter, gate connecting metal layer) 113a that connects the gate pad 112 and the gate metal layer 113.

The poly-silicon layer 114 is provided on the gate insulating film 137 on the front surface of the semiconductor substrate 150, closer to the chip center than is the field oxide film 121. The poly-silicon layer 114 extends on the field oxide film 121 and toward the chip end, from on the gate insulating film 137 and is disposed directly beneath the gate metal layer 113, directly beneath the gate pad 112, and directly beneath the gate connecting metal layer 113a, the poly-silicon layer 114 terminates within a plane of the first face 153a of the front surface of the semiconductor substrate 150. A first portion 114a of the poly-silicon layer 114 directly beneath the gate metal layer 113 is the gate runner connected to gate electrodes 138, at ends the trenches 136.

The first portion 114a of the poly-silicon layer 114 surrounds a periphery of the active region 101. A chip-center-side edge 114a' (edge nearest the chip center) of the first portion 114a of the poly-silicon layer 114 is positioned closer to the chip center than is a chip-center-side edge 121a' (edge nearest the chip center) of a first portion 121a of the field oxide film 121 directly beneath the gate metal layer 113. An edge 114b' of a second portion 114b of the poly-silicon layer 114 directly beneath the gate pad 112 terminates at a position farther from the gate pad 112 than does an edge 121b' of a second portion 121b of the field oxide film 121 directly beneath the gate pad 112.

An edge 114c' of a third portion 114c of the poly-silicon layer 114 directly beneath the gate connecting metal layer 113a terminates at a position farther from the gate pad 112 than does an edge 121c' of a third portion 121c of the field oxide film 121 directly beneath the gate connecting metal layer 113a. The trenches 136, in the active region 101, are provided in a striped shape along a first direction X parallel to the front surface of the semiconductor substrate 150 and extend from the active region 101 toward the edge termination region 102. The ends of the trenches 136 oppose the chip-center-side edge 114a' of the first portion 114a of the poly-silicon layer 114 in a depth direction Z.

The gate electrodes 138 are provided in the trenches 136 via the gate insulating film 137. In FIG. 13, the chip-center-side edge 114a' of the first portion 114a of the poly-silicon layer 114, a chip-end-side edge (edge nearest the chip end) of the first portion 114a, and the edges 114b', 114c' of the second and the third portions 114b, 114c are indicated by bold solid lines. A chip-end-side edge of the first portion 121a of the field oxide film 121 is positioned at the chip end. In FIG. 13, the chip-center-side edge 121a' of the first portion 121a of the field oxide film 121 and the edges 121b', 121c' of the second and the third portions 121b, 121c of the field oxide film 121 are indicated by a dashed line bolder than that of the perimeter 111a of the source pad 111.

On the first portion 114a of the poly-silicon layer 114, the gate metal layer 113 is provided on an interlayer insulating film 122. The gate metal layer 113 surrounds a periphery of the active region 101. The gate metal layer 113 is electrically connected to the first portion 114a of the poly-silicon layer 114 via a contact hole 122a of the interlayer insulating film 122 and is electrically connected to the gate pad 112 via the gate connecting metal layer 113a. A portion directly beneath the gate metal layer 113 has 3-layer structure in which the gate insulating film 137, the first portion 121a of the field oxide film 121, and the first portion 114a of the poly-silicon layer 114 are sequentially stacked on the front surface of the semiconductor substrate 150.

Further, the chip-center-side edge 114a' of the first portion 114a of the poly-silicon layer 114 is closer to the chip center than is the chip-center-side edge 121a' of the first portion 121a of the field oxide film 121. Therefore, a portion adjacent to a side of the 3-layer structure nearest the chip center has a 2-layer structure in which only the gate insulating film 137 and the first portion 114a of the poly-silicon layer 114 are sequentially stacked on the front surface of the semiconductor substrate 150. A step 115 of a thickness of the field oxide film 121 occurs in the first portion 114a of the poly-silicon layer 114, between a portion on the field oxide film 121 and a portion on the gate insulating film 137.

Due to the step 115, a surface of the first portion 114a of the poly-silicon layer 114 is recessed toward the semiconductor substrate 150 at a portion closer to the chip center than is the first portion 121a of the field oxide film 121. At surfaces of the second and the third portions 114b, 114c of the poly-silicon layer 114, similarly to the surface of the first portion 114a of the poly-silicon layer 114, the step 115 of the thickness of the field oxide film 121 occurs between a portion on the field oxide film 121 and a portion on the gate insulating film 137. The poly-silicon layer 114 and the field oxide film 121 are covered by the interlayer insulating film 122.

The poly-silicon layer 114 is in contact with and electrically connected to the gate metal layer 113 via the contact hole 122a of the interlayer insulating film 122. In FIGS. 14 and 15, a portion 141 is the gate metal layer 113, and indicates a portion from an edge of the gate metal layer 113 nearest the chip end to an edge of the gate metal layer 113 nearest the chip center. A portion 142 is the contact hole 122a of the interlayer insulating film 122. In the contact hole 122a, a contact between the gate metal layer 113 and the poly-silicon layer 114 is formed. Reference numeral 143 is a portion between the gate metal layer 113 and the source pad 111.

A border between the portion 143 and a portion 144 is an edge position of the source pad 111. A border between the portion 144 and a portion 145 is a position of the chip-center-side edge 121a' of the first portion 121a of the field oxide film 121. The portion 145 is a part of a structure in which the gate insulating film 137 and the poly-silicon layer 114 are sequentially stacked on the front surface of the semiconductor substrate 150. Reference 146 is a portion from the chip-center-side edge 114a' of the first portion 114a of the poly-silicon layer 114, to an edge of the interlayer insulating film 122 nearest the chip center, the interlayer insulating film 122 covering the first portion 114a of the poly-silicon layer 114.

The semiconductor substrate 150 is an epitaxial substrate in which an $n^-$-type semiconductor layer 151 and a p-type semiconductor layer 152 are sequentially formed on an $n^+$-type starting substrate (not depicted) by epitaxial growth. The $n^-$-type semiconductor layer 151 configures an $n^-$-type drift region 131. A portion of the p-type semiconductor layer 152 nearest the chip end is removed by etching, leaving the p-type semiconductor layer 152 in a mesa (trapezoid) shape in the chip center. Removal of the portion of the p-type semiconductor layer 152 nearest the chip end forms a step 153 at the front surface of the semiconductor substrate 150 in the edge termination region 102. At a mesa edge 153c of the step 153, a side surface of the p-type semiconductor layer 152 left in the mesa shape is exposed.

The front surface of the semiconductor substrate 150, with the step 153 as a border, is recessed toward a drain electrode (not depicted) to a greater extent at the second face 153b toward the chip end than at the first face 153a toward the chip center. The p-type semiconductor layer 152 configures a p-type base region 132. In other words, the p-type base region 132 extends from the active region 101 to the mesa edge 153c of the step 153 in the edge termination region 102. The mesa edge 153c of the step 153 is a portion of the front surface of the semiconductor substrate 150, connecting the first face 153a that is closer to the chip center than is the step 153 and the recessed second face 153b that is closer to the chip end than is the step 153.

A $p^{++}$-type contact region 135 (hereinafter, edge $p^{++}$-type contact region 135') forming an ohmic contact with a source electrode 139 in a contact hole 122b of the interlayer insulating film 122, extends from the active region 101 to a portion of the p-type semiconductor layer 152 (the p-type base region 132) in the edge termination region 102. The edge $p^{++}$-type contact region 135' extends closer to the chip end than does the first portion 114a of the poly-silicon layer 114 and terminates closer to the chip center than does the mesa edge 153c of the step 153. The edge $p^{++}$-type contact region 135' also extends directly beneath the gate pad 112.

A distance d101 from the mesa edge 153c of the step 153 to the edge $p^{++}$-type contact region 135' is 15 μm. A distance d102 between respective chip-end-side edges of the first portion 114a of the poly-silicon layer 114 and the edge $p^{++}$-type contact region 135' is 2 μm, the respective chip-end-side edges being respective edges nearest the chip end. A distance d103 from the chip-end-side edge of the first portion 114a of the poly-silicon layer 114 to the chip-center-side edge 121a' of the first portion 121a of the field oxide film 121 is 73 μm. A distance d104 from the gate metal layer 113 to the source pad 111 is 10 μm. A width d105 of the gate metal layer 113 is 36 μm.

By ion implantation in a surface region of a portion of the $n^-$-type semiconductor layer 151 forming the second face 153b of the front surface of the semiconductor substrate 150, a $p^-$-type region 163 is selectively formed. The $p^-$-type region 163 configures a voltage withstanding structure electrically connected to the source electrode 139 and having a junction termination extension (JTE) structure. The $p^-$-type region 163 surrounds a periphery of the active region 101. Between the $p^-$-type region 163 and the active region 101, $p^+$-type regions 162a', 162b' are provided opposing and adjacent to each other in the depth direction Z at a position closer to the drain electrode than is the p-type base region 132.

The $p^+$-type regions 162a' are in contact with the $p^-$-type region 163 and the $p^+$-type regions 162b'. The $p^+$-type regions 162b' are in contact with the $p^-$-type region 163 and the p-type base region 132. The $p^+$-type regions 162a', 162b' surround a periphery of the active region 101. The $p^+$-type regions 162a', 162b' extend directly beneath the gate pad 112. The $p^+$-type regions 162a', 162b' are formed concurrently with the $p^+$-type regions 162a, 162b of the active region 101. The $p^+$-type regions 161, 162a, 162b of the active region 101 are depleted when the MOSFET is OFF and have a function of mitigating electric field applied to bottoms of the trenches 136.

The p$^+$-type region 161 is disposed in plural separated from the p-type base region 132, at positions closer to the drain electrode than is the p-type base region 132. The p$^+$-type regions 161 oppose the bottoms of the trenches 136 in the depth direction Z. The p$^+$-type regions 162a, 162b are provided between the trenches 136 that are adjacent to each other, the p$^+$-type regions 162a, 162b are provided separated from the trenches 136 and the p$^+$-type regions 161. The p$^+$-type regions 162a are provided separated from the p-type base region 132, at positions closer to the drain electrode than is the p-type base region 132. The p$^+$-type regions 162b are provided between the p-type base region 132 and the p$^+$-type regions 162a, and are in contact with the p-type base region 132 and the p$^+$-type regions 162a.

The source electrode 139 forms, in the contact hole 122b of the interlayer insulating film 122, an ohmic contact with n$^+$-type source regions 134 and the p$^{++}$-type contact region 135. The source electrode 139, in the contact hole 122b of the interlayer insulating film 122, is connected to the source pad 111. On a back surface side of the semiconductor substrate 150, an n$^+$-type drain region and the drain electrode are provided. Reference numeral 123 is a passivation film. Reference numeral 133 is an n-type region forming a so-called current spreading layer (CSL) and provided in the n$^-$-type drift region 131.

As such a conventional SiC-MOSFET, a device has been proposed in which a poly-silicon layer is provided on a gate insulating film, between a gate metal layer of the edge termination region and the gate insulating film on a front surface of a semiconductor substrate, extending from the active region to directly beneath the gate metal layer (for example, refer to Japanese Laid-Open Patent Publication No. 2018-206873, Japanese Laid-Open Patent Publication No. 2018-117016, Japanese Laid-Open Patent Publication No. 2014-175314). In Japanese Laid-Open Patent Publication No. 2018-206873, a p-type region for leading out charge (holes) to a corner portion (vertex of a rectangle) of the active region is disposed, thereby forming a structure in which electric field due to charge generated at the edge termination region is not applied to a field oxide film between the p-type base region and a gate runner, and dielectric breakdown of the field oxide film is prevented.

In Japanese Laid-Open Patent Publication No. 2018-117016, a p-type RESURF region is disposed between an active region and a voltage withstanding structure of an edge termination region, so as to oppose a mesa edge of a step in a depth direction, whereby a structure is formed in which a part where electric field concentration between the active region and the voltage withstanding structure does not occur. In Japanese Laid-Open Patent Publication No. 2014-175314, a source pad is planarized, and variations breakdown voltage characteristics and breakdown voltage defects due to the variations are prevented by reducing a thickness of an interlayer insulating film to be thinner at a portion on an active region than at a portion on an edge termination region and designing a thickness of a portion of the interlayer insulating film on the edge termination region to be a thickness that does not affect electric field distribution of the edge termination region.

SUMMARY OF THE INVENTION

According to an embodiment of the invention, a silicon carbide semiconductor device includes an active region, a termination region provided at a periphery of the active region, a semiconductor substrate containing silicon carbide, an insulated gate structure provided at a front surface side of the semiconductor substrate, the insulated gate structure being provided in the active region and including a metal oxide semiconductor field effect transistor formed by a 3-layer structure of a metal, an oxide film and a semiconductor, the semiconductor substrate including a first-conductivity-type semiconductor layer, configuring a drift region of the metal oxide semiconductor field effect transistor, and a second-conductivity-type semiconductor layer provided at the front surface side of the semiconductor substrate, and on the first-conductivity-type semiconductor layer, the second-conductivity-type semiconductor layer configuring a base region of the metal oxide semiconductor field effect transistor, a trench provided at the front surface side of the semiconductor substrate and extending in a first direction parallel to a front surface of the semiconductor substrate, an insulating film provided at the front surface side of the semiconductor substrate, a gate electrode of the metal oxide semiconductor field effect transistor provided in the trench via the insulating film, a second-conductivity-type high-concentration region, provided in a surface region at the front surface side of the semiconductor substrate in the termination region, the second-conductivity-type high-concentration region forming a second-conductivity-type junction with the second-conductivity-type semiconductor layer, the second-conductivity-type high-concentration region having an impurity concentration higher than an impurity concentration of the second-conductivity-type semiconductor layer, a first gate poly-silicon layer provided on the front surface of the semiconductor substrate in the termination region via the insulating film, and facing the second-conductivity-type high-concentration region via the insulating film in a depth direction, the first gate poly-silicon layer surrounding the periphery of the active region, and having a rectangular ring shape, the first gate poly-silicon layer being electrically connected to the gate electrode at an end of the trench, and a field oxide film provided on the front surface of the semiconductor substrate in the termination region via the insulating film, the field oxide film surrounding a periphery of the first gate poly-silicon layer, and having a rectangular ring shape with four side parts, two of which extend in the first direction and the other two of which extend in a second direction orthogonal to the first direction. At least one side part of the field oxide film that extends in the second direction is disposed from an outer periphery of the termination region toward the active region in the first direction, a closest edge to the active region of the at least one side part is located at a position further from the active region than is a position of a furthest edge from the active region of the first gate poly-silicon layer.

In the embodiment, at least one side part of the field oxide film that extends in the first direction is disposed from the outer periphery of the termination region toward the active region in the second direction, a closest edge to the active region of the at least one side part extending in the first direction is located at a same position as a closest edge from the active region of the first gate poly-silicon layer.

In the embodiment, the at least one side part includes the two side parts of the field oxide film that extend in the first direction and are each disposed from the outer periphery of the termination region toward the active region in the second direction, a closest edge to the active region of each of the two side parts extending in the first direction is located to the same position as the closest edge from the active region of the first gate poly-silicon layer.

In the embodiment, a furthest edge from the active region of the second-conductivity-type high-concentration region is located at a position closer to the active region than is a position of a furthest edge from the active region of the second-conductivity-type semiconductor layer.

In at least two side parts of the field oxide film that extend in the second direction, a closest edge to the active region of each of the two side parts extending in the second direction is located on the second-conductivity-type semiconductor layer via the insulating film in the depth direction, and is located further from the active region than is a position of the second-conductivity-type junction.

In the embodiment, an outer side edge of the first gate poly-silicon layer is positioned within a plane area of the second-conductivity-type high-concentration region.

In the embodiment, an entire surface of the first gate poly-silicon layer is flat.

In the embodiment, the silicon carbide semiconductor device further includes a second gate poly-silicon layer connected to the first gate poly-silicon layer, and being provided on the front surface of the semiconductor substrate via the insulating film in the active region, and a gate pad provided on the second gate poly-silicon layer via an interlayer insulating film, and being electrically connected to the second gate poly-silicon layer. A region between the front surface of the semiconductor substrate and the second gate poly-silicon layer is free of the field oxide film.

In the embodiment, the insulating film is a high temperature oxide film or a thermal oxide film, the field oxide film is a silicon oxide film, and field oxide film having a thickness greater than a thickness of the insulating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 16 is a cross-sectional view of a structure along cutting line CC-CC' in FIG. 13.

DETAILED DESCRIPTION OF THE INVENTION

First, problems associated with the conventional techniques will be discussed. With the conventional silicon carbide semiconductor device 110 (refer to FIGS. 13 to 16), in a reliability test in which under a high temperature (for example, about 175 degrees C.), voltage of 1200V is applied between a drain and a source, and voltage is applied so that negative bias is between a gate and the source, it was confirmed that for 1000 hours set as a target measurement period, destruction occurred in a measurement period of about 500 hours. Thus, a cross-sectional analysis by emission analysis using an emission microscope (EMS) was performed with respect to the destroyed conventional silicon carbide semiconductor device 110.

Figure 14:
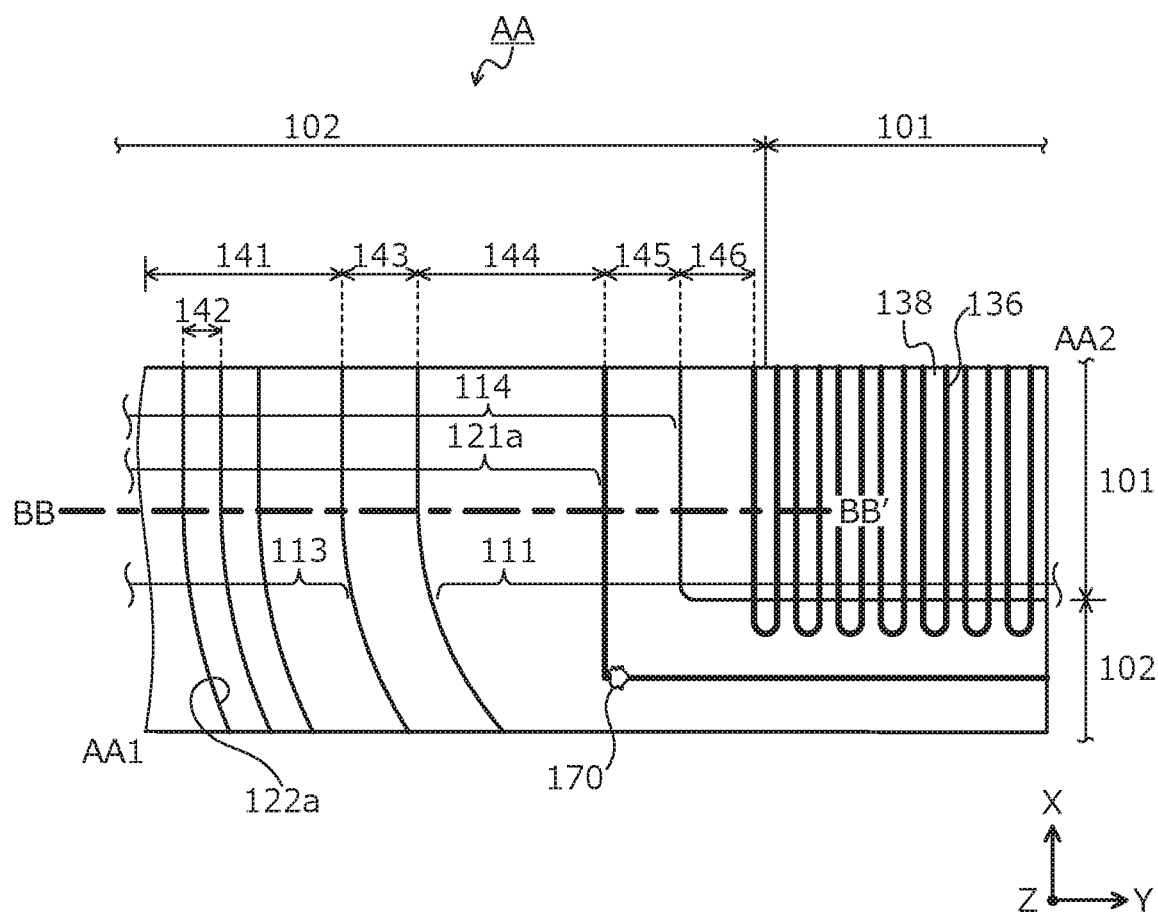
FIG. 14 is an enlarged plan view of a rectangular frame AA in FIG. 13.
Figure 15:
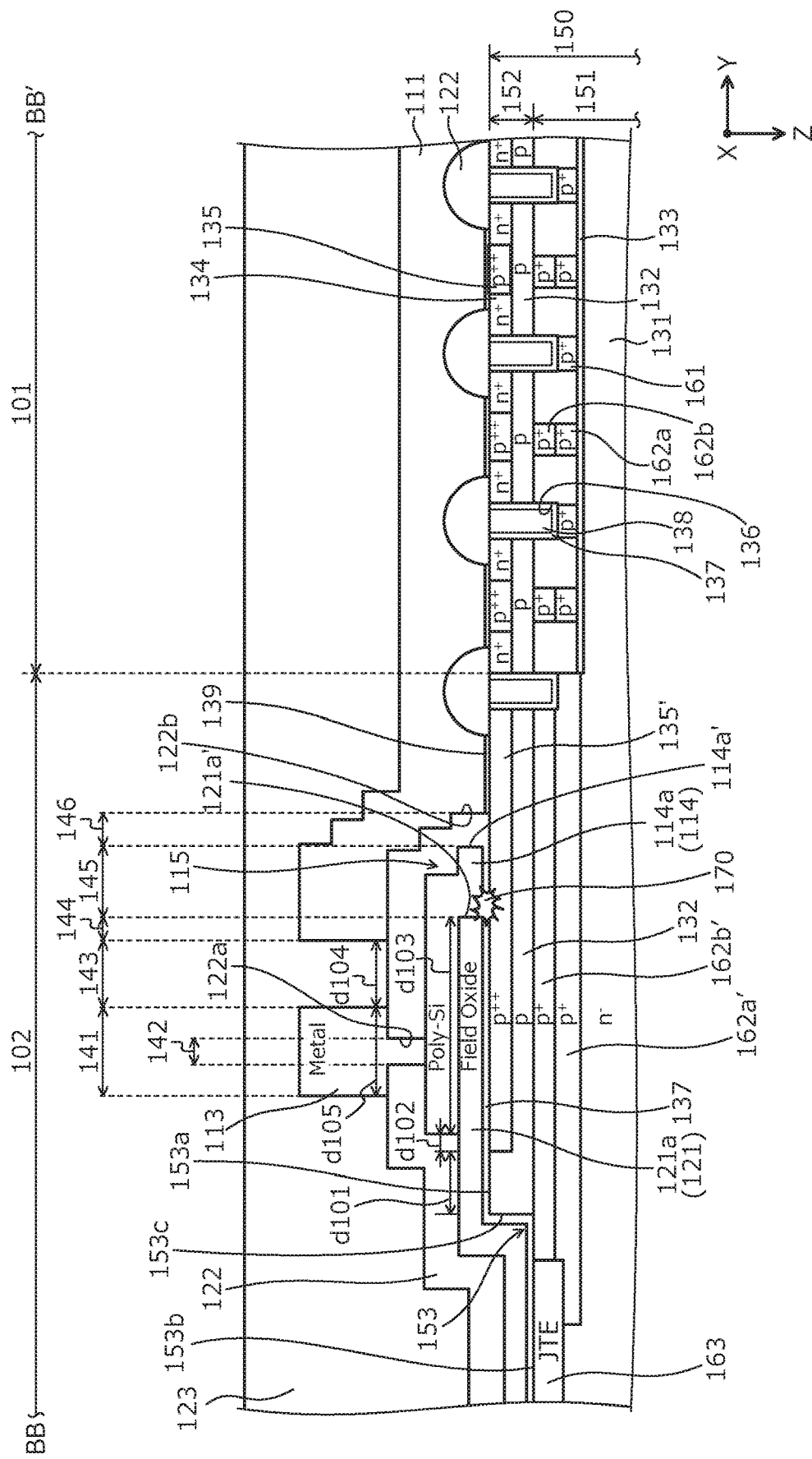
FIG. 15 is a cross-sectional view of a structure along cutting line BB-BB' in FIG. 14.

As for results of the cross-sectional analysis by emission analysis, a light emission 170 indicating generation of leak current in the portion 145 of the 2-layer structure that is adjacent to the chip-center-side edge 121a' of the first portion 121a of the field oxide film 121 and the ends 121b', 121c' (ends nearest the chip center) of the second and the third portions 121b, 121c of the field oxide film 121 on the chip center side and in which the gate insulating film 137 and the poly-silicon layer 114 are sequentially stacked on the front surface of the semiconductor substrate 150 was observed, confirming that the gate insulating film 137 experiences dielectric breakdown at the location of the light emission 170 (FIGS. 14 and 15).

A reason for destruction occurring in the portion 145 of the 2-layer structure is that when voltage is applied under the predetermined conditions above, electric field concentration is surmised to occur at the chip-center-side edge 114a' of the first portion 114a of the poly-silicon layer 114 and the edges 114b', 114c' of the second and the third portions 114b, 114c. In an OFF state, a portion of hole current that generated in the edge termination region 102 passes through the edge $p^{++}$-type contact region 135', is lead out toward the source electrode 139, becomes leak current and at a part where electric field concentrates, is injected into the gate insulating film 137, causing dielectric breakdown.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
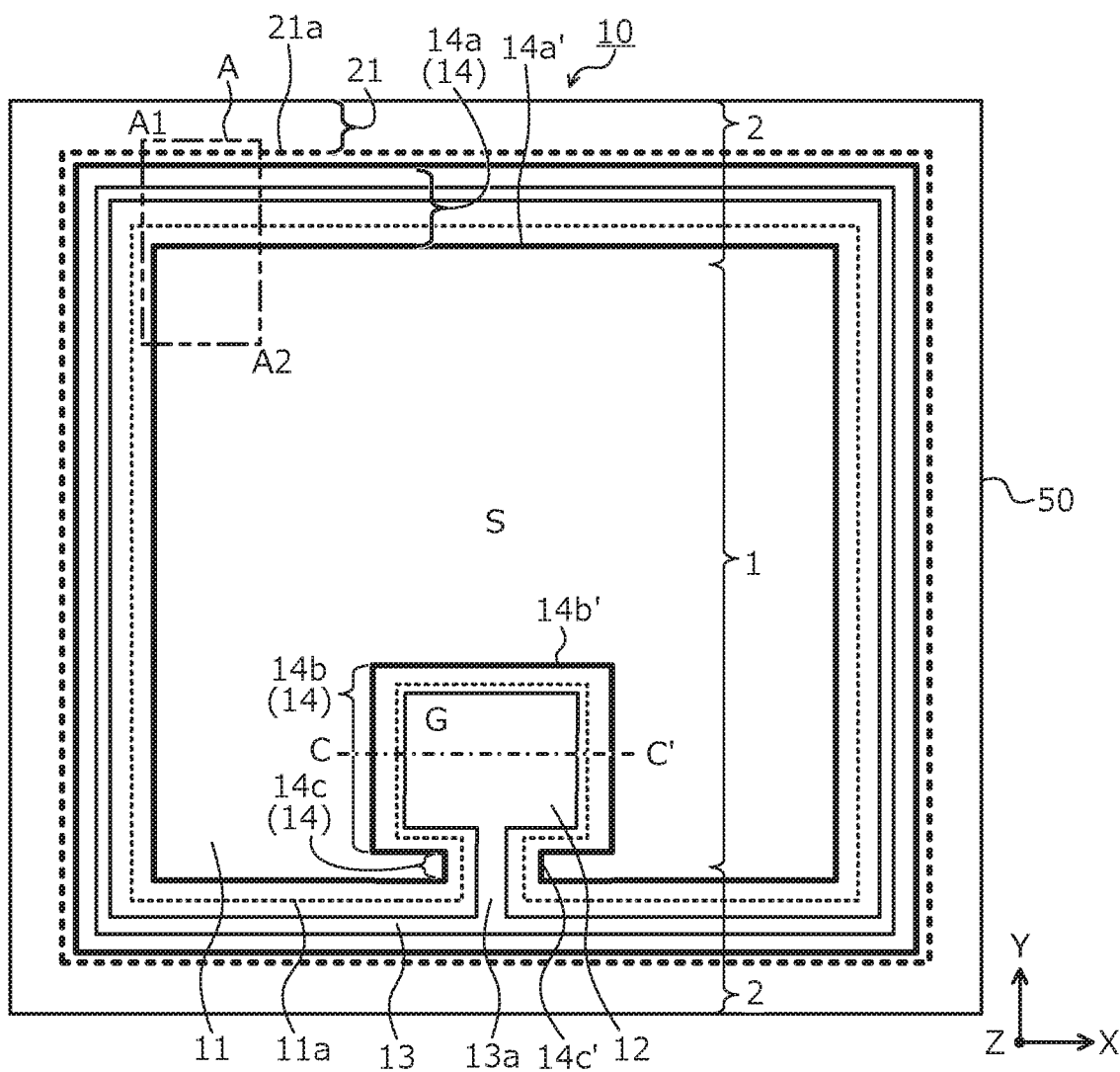
FIG. 1 is a plan view of a layout when a silicon carbide semiconductor device according to a first embodiment is viewed from a front surface side of a semiconductor substrate.
Figure 2:
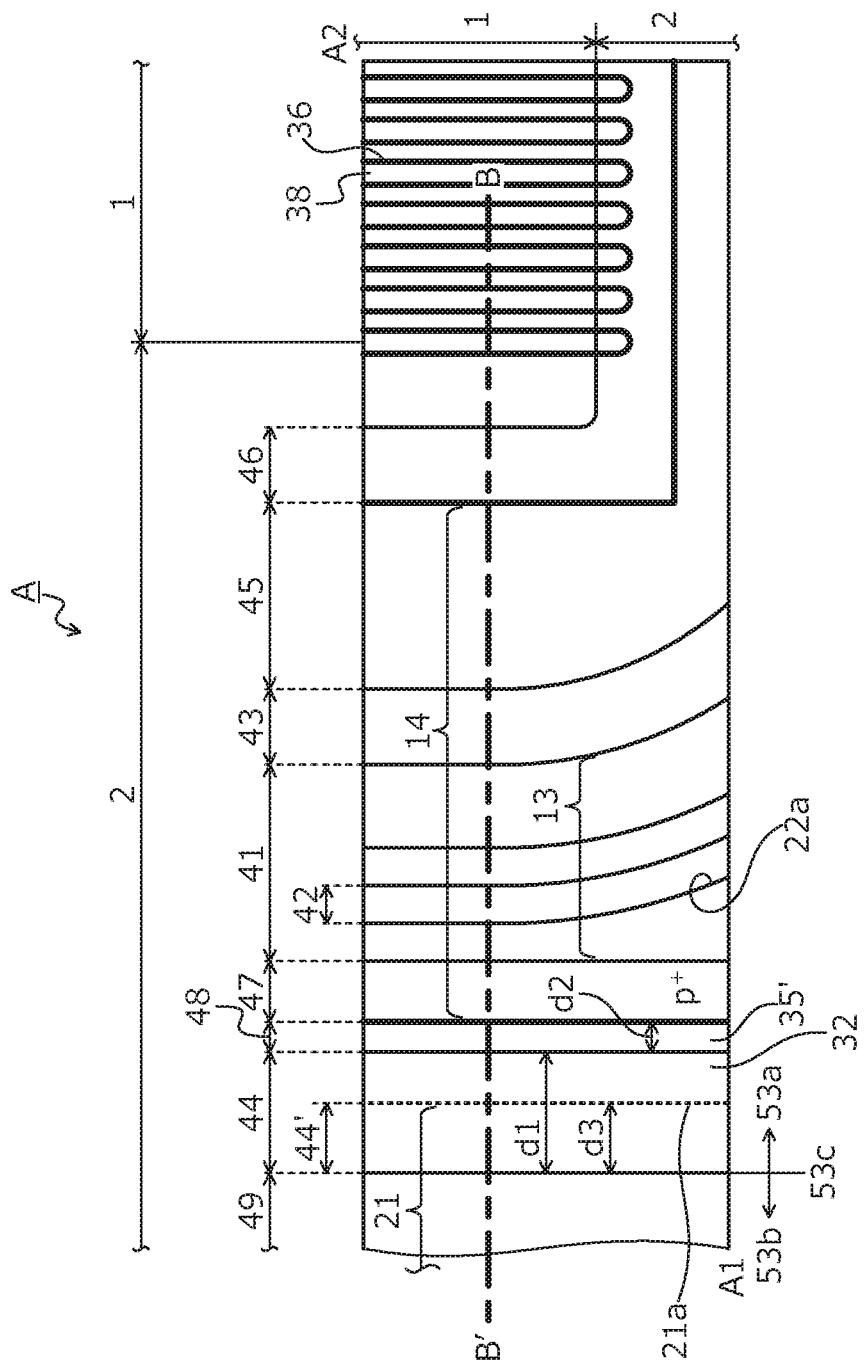
FIG. 2 is an enlarged plan view of a rectangular frame A in FIG. 1.
Figure 3:
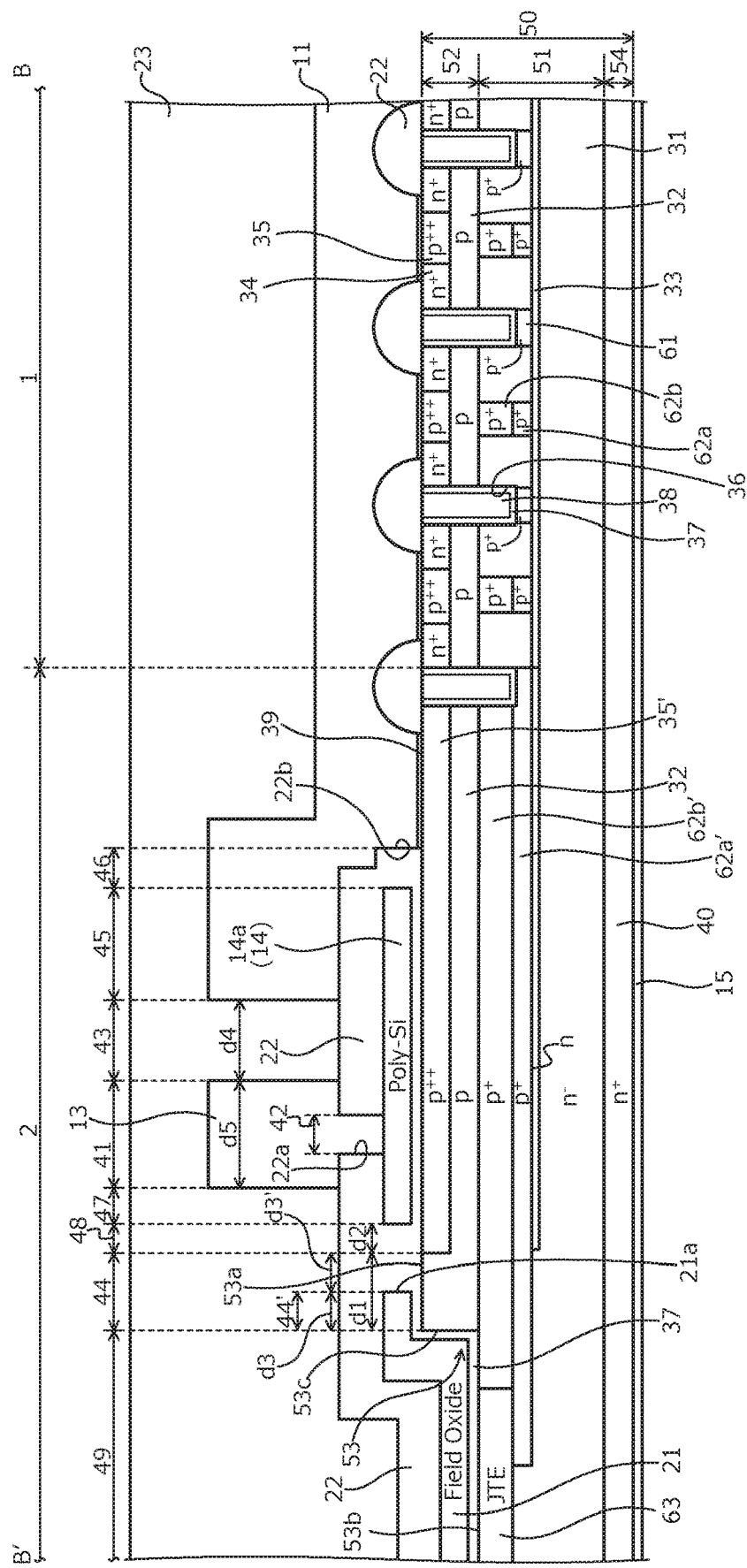
FIG. 3 is a cross-sectional view of a structure along cutting line B-B' in FIG. 2.
Figure 4:
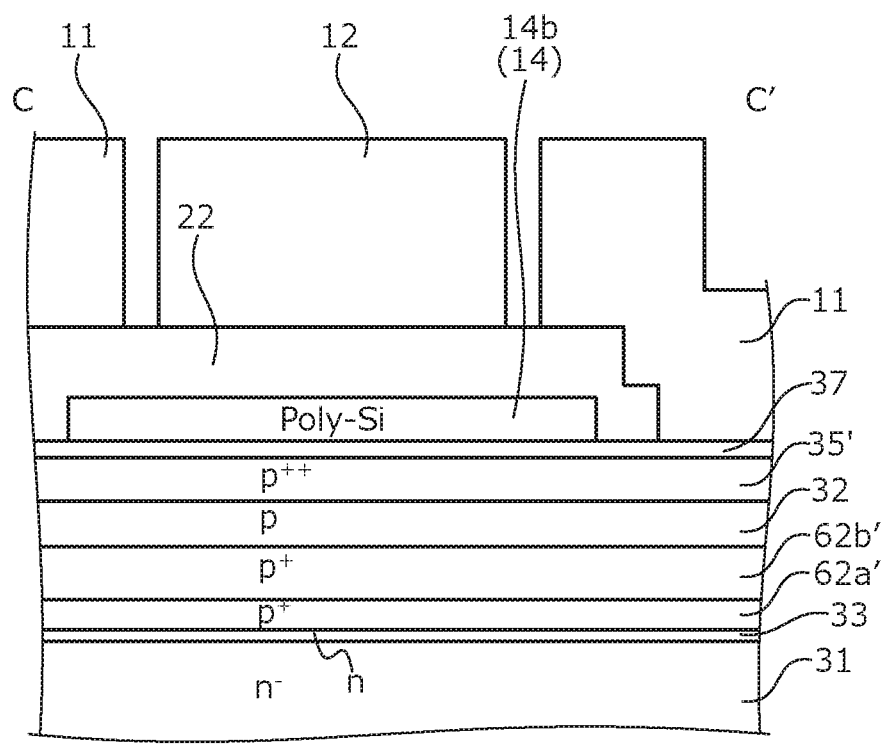
FIG. 4 is a cross-sectional view of a structure along cutting line C-C' in FIG. 1.

A structure of a silicon carbide semiconductor device according to a first embodiment will be described. FIG. 1 is a plan view of a layout when the silicon carbide semiconductor device according to the first embodiment is viewed from a front surface side of a semiconductor substrate. FIG. 2 is an enlarged plan view of a rectangular frame A in FIG. 1. A portion surrounded by the rectangular frame A having as a pair of vertices a vertex A1 toward a corner portion (one vertex of a semiconductor substrate (semiconductor chip) 50 having a substantially rectangular planar shape) of the semiconductor substrate 50 and a vertex A2 toward a center of the semiconductor substrate 50 is a portion of an edge termination region 2. FIG. 3 is a cross-sectional view of a structure along cutting line B-B' in FIG. 2. FIG. 4 is a cross-sectional view of a structure along cutting line C-C' in FIG. 1.

The silicon carbide semiconductor device 10 according to the first embodiment and depicted in FIGS. 1 to 4 is a vertical MOSFET having a trench gate structure that includes in the edge termination region 2 that surrounds a periphery an active region 1, a gate metal layer 13 and a poly-silicon (poly-Si) layer 14. The active region 1 is a region through which current flows when an element is in an ON state. The edge termination region 2 is a region between the active region 1 and an end of the semiconductor substrate 50, and is a region for mitigating electric field on a front surface side of the semiconductor substrate 50 and for sustaining a breakdown voltage. In the edge termination region 2, a voltage withstanding structure such as a junction termination extension (JTE) structure is disposed. The breakdown voltage is a voltage limit at which no errant operation or destruction of an element occurs.

In the active region 1, on a first face 53a described hereinafter of a front surface of the semiconductor substrate 50, a source pad 11 and a gate pad 12 are provided separated from each other. The source pad 11 has a substantially rectangular planar shape in which a portion is recessed inwardly. The source pad 11 occupies most of a surface area of the active region 1 and extends from the active region 1 into the edge termination region 2. FIG. 1, a perimeter 11a of the source pad 11 is indicated by a dashed line thinner than that for a field oxide film 21 described hereinafter. The gate pad 12 is provided in the recessed portion of the source pad 11 and has a substantially rectangular planar shape surrounded on three sides by the source pad 11.

In the active region 1, on the front surface side of the semiconductor substrate 50, parts configuring a MOS gate structure are provided. The semiconductor substrate 50 is an epitaxial substrate in which an $n^-$-type semiconductor layer (first-conductivity-type semiconductor layer) 51 and a p-type semiconductor layer (second-conductivity-type semiconductor layer) 52 are sequentially formed by epitaxial growth on an $n^+$-type starting substrate 54. A main surface of the semiconductor substrate 50 having the p-type semiconductor layer 52 is assumed as a front surface while a main surface (back surface of the $n^+$-type starting substrate 54) of the semiconductor substrate 50 having the $n^+$-type starting substrate 54 is assumed as a back surface. A chip size of the semiconductor substrate 50, for example, may be a 3.8 mm square. The MOS gate structure is configured by a p-type base region 32, $n^+$-type source regions 34, $p^{++}$-type contact regions 35, trenches 36, a gate insulating film 37, and gate electrodes 38.

The $n^+$-type starting substrate 54 configures an $n^+$-type drain region 40. The $n^-$-type semiconductor layer 51 configures an $n^-$-type drift region 31. In the $n^-$-type drift region 31, an n-type region 33 and $p^+$-type regions 61, 62a, 62b may be provided. The n-type region 33 is a so-called current spreading layer (CSL) that reduces carrier spreading resistance. The n-type region 33 is provided between the $p^+$-type regions 61, 62a that are adjacent to each other. The n-type region 33 may extend into the edge termination region 2 and in this case, for example, terminates closer to a chip center (inward) than is a mesa edge 53c of a step 53. The $p^+$-type regions 61, 62a, 62b deplete when the MOSFET in an OFF state and have a function of mitigating electric field applied to bottoms of the trenches 36.

The $p^+$-type regions 61 are disposed separated from the p-type base region 32, at positions closer to a drain electrode 15 than is the p-type base region 32. The $p^+$-type regions 61 oppose the bottoms of the trenches 36 in the depth direction Z. The $p^+$-type regions 62a, 62b are disposed between the trenches 36 that are adjacent to each other, separated from the trenches 36 and the $p^+$-type regions 61. The $p^+$-type regions 62a are provided separated from the p-type base region 32, at positions closer to the drain electrode 15 than is the p-type base region 32. Each of the $p^+$-type regions 62b is provided between the p-type base region 32 and one of the $p^+$-type regions 62a, and is in contact with the p-type base region 32 and the one of the $p^+$-type regions 62a.

A chip-end-side portion of the p-type semiconductor layer 52 on an outer side (chip end) is removed by etching, leaving the p-type semiconductor layer 52 in a mesa (trapezoid) shape in the chip center. Removal of the chip-end-side (outer side) portion of the p-type semiconductor layer 52 forms the step 53 at the front surface of the semiconductor substrate 50 in the edge termination region 2. At the mesa edge 53c of the step 53, a side surface of the p-type semiconductor layer 52 left in the mesa shape is exposed. The front surface of the semiconductor substrate 50, with the step 53 as a border, is recessed toward the drain electrode 15 described hereinafter to a greater extent at a second face 53b toward the chip end than at the first face 53a toward the active region 1 (toward the chip center).

The p-type semiconductor layer 52 configures the p-type base region 32. In other words, the p-type base region 32 extends from the active region 1 to the mesa edge 53c of the step 53 in the edge termination region 2. The mesa edge 53c of the step 53 is a portion of the front surface of the semiconductor substrate 50, connecting the first face 53a that is closer to the chip center than is the step 53 and the recessed second face 53b that is closer to the chip end than is the step 53. In the active region 1, between the first face 53a of the front surface of the semiconductor substrate 50 and the p-type base region 32, the $n^+$-type source regions 34 and the $p^{++}$-type contact regions 35 are selectively provided in contact with the p-type base region 32.

The trenches 36 penetrate through the $n^+$-type source regions 34 and the p-type base region 32, and reach the $n^-$-type drift region 31. The trenches 36 are not provided directly beneath the gate pad 12. The trenches 36 extend from the active region 1 into the edge termination region 2 in a striped shape along the first direction X parallel to the front surface of the semiconductor substrate 50. Ends of the trenches 36 oppose, in the depth direction Z, a chip-center-side edge (edge nearest the chip center) 14a' of a first portion (first gate poly-silicon layer) 14a described hereinafter of the poly-silicon layer 14. Further, the ends of the trenches 36 oppose, in the depth direction Z, edges 14b', 14c' of second and third portions 14b, 14c described hereinafter of the poly-silicon layer 14.

In the trenches 36, the gate electrodes 38 containing poly-silicon are provided via the gate insulating film 37. The gate insulating film 37, for example, may be a high temperature oxide (HTO) film, or a thermal oxide film. The gate electrodes 38, for example, are a poly-silicon layer. The gate electrodes 38, at the ends of the trenches 36, are connected to any of the first to the third portions 14a to 14c of the poly-silicon layer 14. An interlayer insulating film 22 is provided on the front surface of the semiconductor substrate 50 overall so as to cover the gate electrodes 38. For example, a non-doped silicate glass (NSG) and a borophosphosilicate glass (BPSG) may be sequentially deposited as the interlayer insulating film 22.

The source electrode 39, in a contact hole 22b of the interlayer insulating film 22, forms an ohmic contact with the $n^+$-type source regions 34 and the $p^{++}$-type contact regions 35, and is connected to the source pad 11. The source pad 11 is provided on the interlayer insulating film 22 so as to be embedded in the contact hole 22b of the interlayer insulating film 22 and covers substantially the entire first face 53a of the front surface of the semiconductor substrate 50 in the active region 1, excluding a portion of the gate pad 12. The gate pad 12 is provided on the interlayer insulating film 22 and covers a portion of the first face 53a of the front surface of the semiconductor substrate 50 in the active region 1. The gate electrodes 38 are electrically connected to the gate pad 12 via the poly-silicon layer 14.

In the edge termination region 2, on the front surface of the semiconductor substrate 50, the gate insulating film 37 extends from inner walls of the trenches 36 in the active region 1. The field oxide film 21 is provided in contact with the gate insulating film 37 of the second face 53b of the front surface of the semiconductor substrate 50. The field oxide film 21 extends toward the chip center from the chip end and, on the first face 53a of the front surface of the semiconductor substrate 50, terminates closer to the chip end than is the first portion 14a of the poly-silicon layer 14. The field oxide film 21 is disposed separated from the poly-silicon layer 14 and surrounds a periphery of the first portion 14a of the poly-silicon layer 14.

A chip-center-side edge (edge nearest the chip center) 21a of the field oxide film 21 is positioned closer to the chip center than is the mesa edge 53c of the step 53 and closer to the chip end than is an edge $p^{++}$-type contact region (second-conductivity-type high-concentration region) 35' described hereinafter. In other words, the chip-center-side edge 21a of the field oxide film 21 is positioned on the p-type base region 32 exposed at the first face 53a of the front surface of the semiconductor substrate 50 in a portion 44 between the mesa edge 53c of the step 53 and the edge $p^{++}$-type contact region 35'. As a result, dielectric breakdown of the field oxide film 21 on the $p^{++}$-type contact region 35' may be prevented.

A position of the chip-center-side edge 21a of the field oxide film 21 may be variously changed in the portion 44 between the mesa edge 53c of the step 53 and the edge $p^{++}$-type contact region 35' according to design conditions. In particular, a distance d1 from the mesa edge 53c of the step 53 to the edge $p^{++}$-type contact region 35' is determined in advance by design specifications and, for example, is about 15 μm. In this case, the chip-center-side edge 21a of the field oxide film 21 terminates at a position separated from the mesa edge 53c of the step 53 by more than 0.5 μm toward the chip center and less than 15 μm from the mesa edge 53c of the step 53, toward the chip center.

When a distance d3 that the chip-center-side edge 21a of the field oxide film 21 is from the mesa edge 53c of the step 53 toward the chip center is 13 μm, a distance d3' from the chip-center-side edge 21a of the field oxide film 21 to the edge $p^{++}$-type contact region 35' is 2 μm. Further, when the distance d3 is 10 μm, the distance d3' from the chip-center-side edge 21a of the field oxide film 21 to the edge $p^{++}$-type contact region 35' is 5 μm. The field oxide film 21, for example, may be a silicon oxide ($SiO_2$) film having a high bandgap and high heat resistance as compared to other insulating films. A thickness of the field oxide film 21 is greater than a thickness of the gate insulating film 37.

The poly-silicon layer 14 is provided on the gate insulating film 37 on the front surface of the semiconductor substrate 50, closer to the chip center than is the field oxide film 21. The poly-silicon layer 14 is provided directly beneath the gate metal layer 13, directly beneath the gate pad 12, and directly beneath a metal layer (hereinafter, gate connecting metal layer) 13a connecting the gate pad 12 and the gate metal layer 13, the poly-silicon layer 14 terminates within a plane of the first face 53a of the front surface of the semiconductor substrate 50. The poly-silicon layer 14 overall is positioned within a plane of the edge $p^{++}$-type contact region 35'. In the figures, a case in which the gate insulating film 37 is formed by thermal oxidation is assumed and depicted. Normally, a formation process of the field oxide film 21 is a process before a formation process of the gate insulating film 37 and therefore, when the gate insulating film 37 is a HTO film, a vertical stacking relationship between the field oxide film 21 and the gate insulating film 37 is interchanged.

The first portion 14a of the poly-silicon layer 14 directly beneath the gate metal layer 13 is a gate runner connected to the gate electrodes 38 at the ends of the trenches 36. The first portion 14a of the poly-silicon layer 14 opposes the gate metal layer 13 overall in the depth direction Z and surrounds a periphery of the active region 1. The poly-silicon layer 14 extends toward the chip center and terminates so that the chip-center-side edge 14a' of the first portion 14a is at a position opposing the perimeter 11a of the source pad 11 in the depth direction Z. A chip-end-side edge (edge nearest the chip end) of the first portion 14a of the poly-silicon layer 14 is positioned within a plane of the edge $p^{++}$-type contact region 35'. For example, a distance d2 between respective edges of the first portion 14a of the poly-silicon layer 14 and the edge $p^{++}$-type contact region 35', the respective edges nearest the chip end, is about 2 μm.

The second portion (second gate poly-silicon layer) 14b of the poly-silicon layer 14 directly beneath the gate pad 12 opposes the gate pad 12 overall in the depth direction Z. The poly-silicon layer 14 extends away from the gate pad 12 in directions (first and second directions X, Y) parallel to the front surface of the semiconductor substrate 50 and terminates so that the edge 14b' of the second portion 14b is at a position opposing the perimeter 11a of the source pad 11 in the depth direction Z. A third portion 14c of the poly-silicon layer 14 directly beneath the gate connecting metal layer 13a opposes the gate connecting metal layer 13a overall in the depth direction Z. The poly-silicon layer 14 extends in a direction (in FIG. 1, the first direction X) parallel to the front surface of the semiconductor substrate 50 and away from the gate connecting metal layer 13a and terminates so that an edge 14c' of the third portion 14c is at a position opposing the perimeter 11a of the source pad 11 in the depth direction Z.

An inner peripheral planar shape of the poly-silicon layer 14 is similar to a planar shape of the perimeter 11a of the source pad 11 and slightly smaller than the perimeter 11a of the source pad 11. An outer peripheral planar shape of the poly-silicon layer 14 is a rectangular shape slightly smaller than an inner periphery of the field oxide film 21. In FIG. 1, the chip-center-side edge 14a' of the first portion 14a of the poly-silicon layer 14, the chip-end-side edge of the first portion 14a, and the edges 14b', 14c' of the second and the third portions 14b, 14c are indicated by bold solid lines. In FIG. 1, the chip-center-side edge 21a of the field oxide film 21 is indicated by a dashed line that is thicker than that for the perimeter 11a of the source pad 11. A chip-end-side edge of the field oxide film 21 is positioned at the chip end.

On the first portion 14a of the poly-silicon layer 14, the gate metal layer 13 is provided on the interlayer insulating film 22. The gate metal layer 13 surrounds a periphery of the active region 1. The gate metal layer 13 is electrically connected to the first portion 14a of the poly-silicon layer 14 via a contact hole 22a of the interlayer insulating film 22, and is electrically connected to the gate pad 12 via the gate connecting metal layer 13a. A portion directly beneath the gate metal layer 13 has spanning the first portion 14a of the poly-silicon layer 14 overall, a 2-layer structure in which the gate insulating film 37 and the first portion 14a of the poly-silicon layer 14 are sequentially stacked on the first face 53a of the front surface of the semiconductor substrate 50. In other words, at the first portion 14a of the poly-silicon layer 14, a film thickness (thickness) of an insulating film present between the poly-silicon layer 14 and the first face 53a of the front surface of the semiconductor substrate 50 is a same film thickness as that of the gate insulating film 37 formed in the trenches 36 in the active region 1. A same film thickness suffices to be formed by a same manufacturing process and to include film thickness variation of up to ±10%, which is a range of variation within a plane.

The second portion 14b of the poly-silicon layer 14 as well has spanning the second portion 14b of the poly-silicon layer 14 overall, a 2-layer structure in which the gate insulating film 37 and the second portion 14b of the poly-silicon layer 14 are sequentially stacked on the first face 53a of the front surface of the semiconductor substrate 50. The third portion 14c of the poly-silicon layer 14 as well has spanning the third portion 14c of the poly-silicon layer 14 overall, a 2-layer structure in which the gate insulating film 37 and the third portion 14c of the poly-silicon layer 14 are sequentially stacked on the first face 53a of the front surface of the semiconductor substrate 50.

In this manner, the field oxide film 21 does not oppose the poly-silicon layer 14 in the depth direction Z. Therefore, a surface of the poly-silicon layer 14 is flat spanning the poly-silicon layer 14 overall, the step 115 (FIGS. 15, 16) due to the field oxide film 121 does not occur at the surface of the poly-silicon layer 14 like in the conventional structure. The only insulating film between the poly-silicon layer 14 and the first face 53a of the front surface of the semiconductor substrate 50 is the gate insulating film 37 and therefore, during voltage application under the predetermined conditions above, electric field concentration at the chip-center-side edge 14a' of the first portion 14a of the poly-silicon layer 14 and the edges 14b', 14c' of the second and the third portions 14b, 14c does not occur like in the conventional structure.

The poly-silicon layer 14 and the field oxide film 21 are covered by the interlayer insulating film 22. The poly-silicon layer 14 is electrically connected to the gate metal layer 13 via the contact hole 22a of the interlayer insulating film 22.

In the contact hole 22a of the interlayer insulating film 22, a contact between the gate metal layer 13 and the poly-silicon layer 14 is formed. In FIG. 3, portions 41, 42, 43, 44, 44', 45, 46, 47, 48, and 49 respectively correspond to portions 41, 42, 43, 44, 44', 45, 46, 47, 48, and 49 in FIG. 2. A distance d4 from the gate metal layer 13 to the source pad 11, for example, is about 10 µm. A width d5 of the gate metal layer 13, for example, is about 36 µm. The distances d1 to d4 between the parts described above and the width d5 of the gate metal layer 13 are determined by design specifications and are independent of the chip size of the semiconductor substrate 50.

In the edge termination region 2, between the first face 53a of the front surface of the semiconductor substrate 50 and the p-type base region 32, the $p^{++}$-type contact regions 35 (the edge $p^{++}$-type contact region 35') extend from the active region 1. The edge $p^{++}$-type contact region 35' extends closer to the chip end than does the first portion 14a of the poly-silicon layer 14 and terminates closer to the chip center than does the chip-center-side edge 21a of the field oxide film 21. The edge $p^{++}$-type contact region 35', in the contact hole 22b of the interlayer insulating film 22, forms an ohmic contact with the source electrode 39.

A contact (electrical contact) between the edge $p^{++}$-type contact region 35' and the source electrode 39 is a contact for leading out hole current generated at the edge termination region 2 during the OFF state toward the source electrode 39 via the edge $p^{++}$-type contact region 35'. The edge $p^{++}$-type contact region 35', for example, may also extend directly beneath the gate pad 12. A surface region of a portion of the $n^-$-type semiconductor layer 51 forming the second face 53b of the front surface of the semiconductor substrate 50 is ion implanted, whereby a $p^-$-type region 63 is selectively formed. The $p^-$-type region 63 is electrically connected to the source electrode 39 and configures a voltage withstanding structure such as a junction termination extension (JTE) structure. The $p^-$-type region 63 surrounds a periphery of the active region 1.

Between the $p^-$-type region 63 and the active region 1, $p^+$-type regions 62a', 62b' that are adjacent and oppose each other in the depth direction Z are provided at positions closer to the drain electrode 15 than is the p-type base region 32. The $p^+$-type region 62a' is in contact with the $p^-$-type region 63 and the $p^+$-type region 62b'. The $p^+$-type region 62b' is in contact with the $p^-$-type region 63 and the p-type base region 32. The $p^+$-type regions 62a', 62b' surround a periphery of the active region 1. The $p^+$-type regions 62a', 62b', for example, extend directly beneath the gate pad 12. The $p^+$-type regions 62a', 62b' are formed concurrently with the $p^+$-type regions 62a, 62b of the active region 1.

The front surface of the semiconductor substrate 50 is covered by a passivation protective film 23. The drain electrode 15 is provided on the back surface of the semiconductor substrate 50 and is electrically connected to the $n^+$-type drain region 40 (the $n^+$-type starting substrate 54).

As described above, according to the first embodiment, the chip-center-side edge of the field oxide film terminates closer to the chip end than does the poly-silicon layer, whereby without generation of a step at the surface of the poly-silicon layer due to the field oxide film, the entire surface of the poly-silicon layer is flat. Therefore, during voltage application under the predetermined conditions above, the concentration of electric field occurring at the chip-center-side edge of the first portion of the poly-silicon layer in the convention structure does not occur. Therefore, a portion (leak current) of the hole current generated at the edge termination region during the OFF state and passing through the edge p++-type contact region to be lead out toward the source electrode is not injected into the gate insulating film near the contact for leading out the hole current, thereby enabling, dielectric breakdown of the gate insulating film to be prevented.

Figure 5:
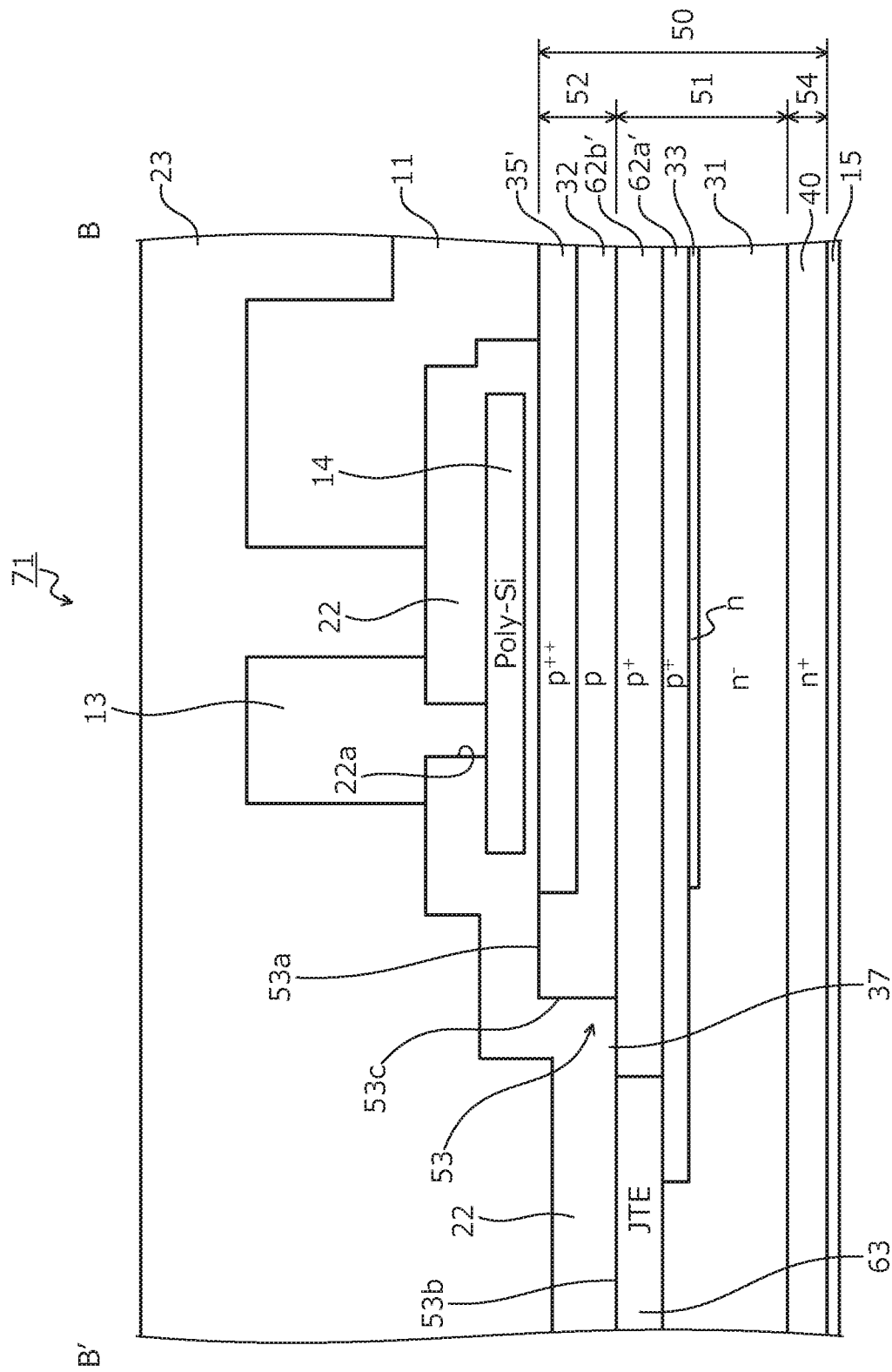
FIG. 5 is a cross-sectional view of a structure of a silicon carbide semiconductor device according to a second embodiment.

A structure of a silicon carbide semiconductor device according to a second embodiment will be described. FIG. 5 is a cross-sectional view of a structure of the silicon carbide semiconductor device according to the second embodiment. A silicon carbide semiconductor device 71 according to the second embodiment differs from the silicon carbide semiconductor device 10 according to the first embodiment (refer to FIGS. 1 to 4) in that no field oxide film covering the front surface of the semiconductor substrate 50 in the edge termination region 2 is provided. A planar structure of the silicon carbide semiconductor device 71 according to the second embodiment is similar to that depicted in FIGS. 1 and 2 from which the field oxide film 21 is removed. FIG. 5 corresponds to a cross-sectional view of a structure along cutting line B-B' in FIG. 2.

As described above, according to the second embodiment, even when the field oxide film is not provided, no step occurs at the surface of the poly-silicon layer, thereby enabling effects similar to those of the first embodiment to be obtained.

Figure 6:
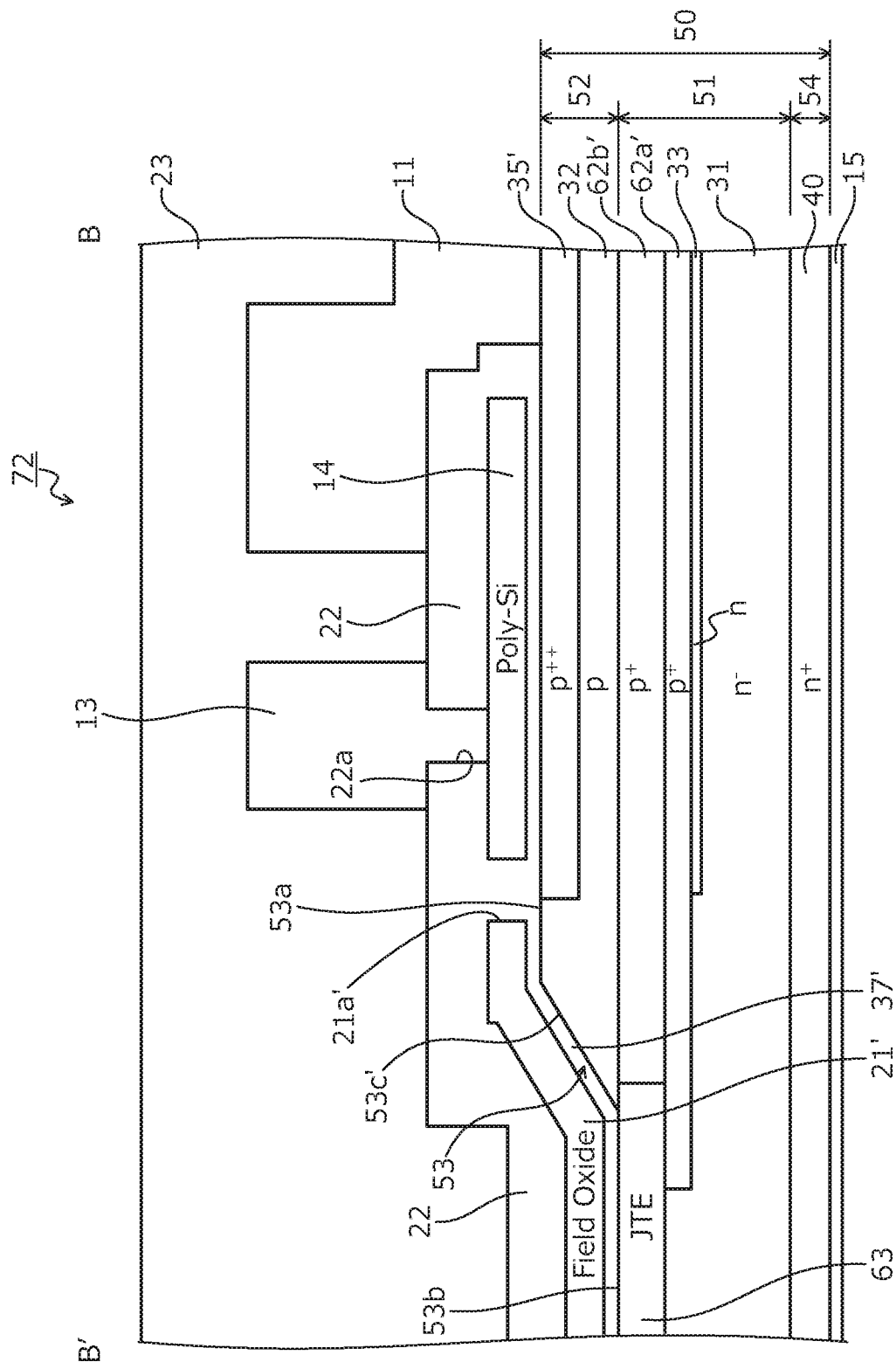
FIG. 6 is a cross-sectional view of a structure of a silicon carbide semiconductor device according to a third embodiment.

A structure of a silicon carbide semiconductor device according to a third embodiment will be described. FIG. 6 is a cross-sectional view of a structure of the silicon carbide semiconductor device according to the third embodiment. A silicon carbide semiconductor device 72 according to the third embodiment differs from the silicon carbide semiconductor device 10 according to the first embodiment (refer to FIGS. 1 to 4) in that a mesa edge 53c' of the step 53 is inclined so as to form an obtuse angle with respect to the first face 53a of the front surface of the semiconductor substrate 50. A planar structure of the silicon carbide semiconductor device 72 according to the third embodiment is similar to that in FIGS. 1 and 2. FIG. 6 corresponds to a cross-sectional view of a structure along cutting line B-B' in FIG. 2.

In the third embodiment, the field oxide film 21' and the gate insulating film 37' are provided on the mesa edge 53c' of the step 53, inclined along the incline of the mesa edge 53c'. As a result, the field oxide film 21' may be deposited uniformly on the mesa edge 53c', whereby reliability is enhanced. Therefore, instances in which due to variation of process accuracy of the field oxide film 21', a chip-center-side edge 21a' of the field oxide film 21' is moved toward the chip center to be positioned on the edge p++-type contact region 35' or the chip-center-side edge 21a' of the field oxide film 21' is moved toward the chip end to be positioned on the mesa edge 53c' of the step 53 may be prevented.

As described above, according to the third embodiment, effects similar to those of the first embodiment may be obtained. Further, according to the third embodiment, the mesa edge of the step is inclined so as to form an obtuse angle with respect to the first and the second faces of the front surface of the semiconductor substrate, whereby the position of the chip-center-side edge of the field oxide film extending from the mesa edge of the step toward the first face of the semiconductor substrate may be set with good accuracy on the p-type base region exposed at the first face of the front surface of the semiconductor substrate, between the mesa edge of the step and the edge p++-type contact region.

Figure 7:
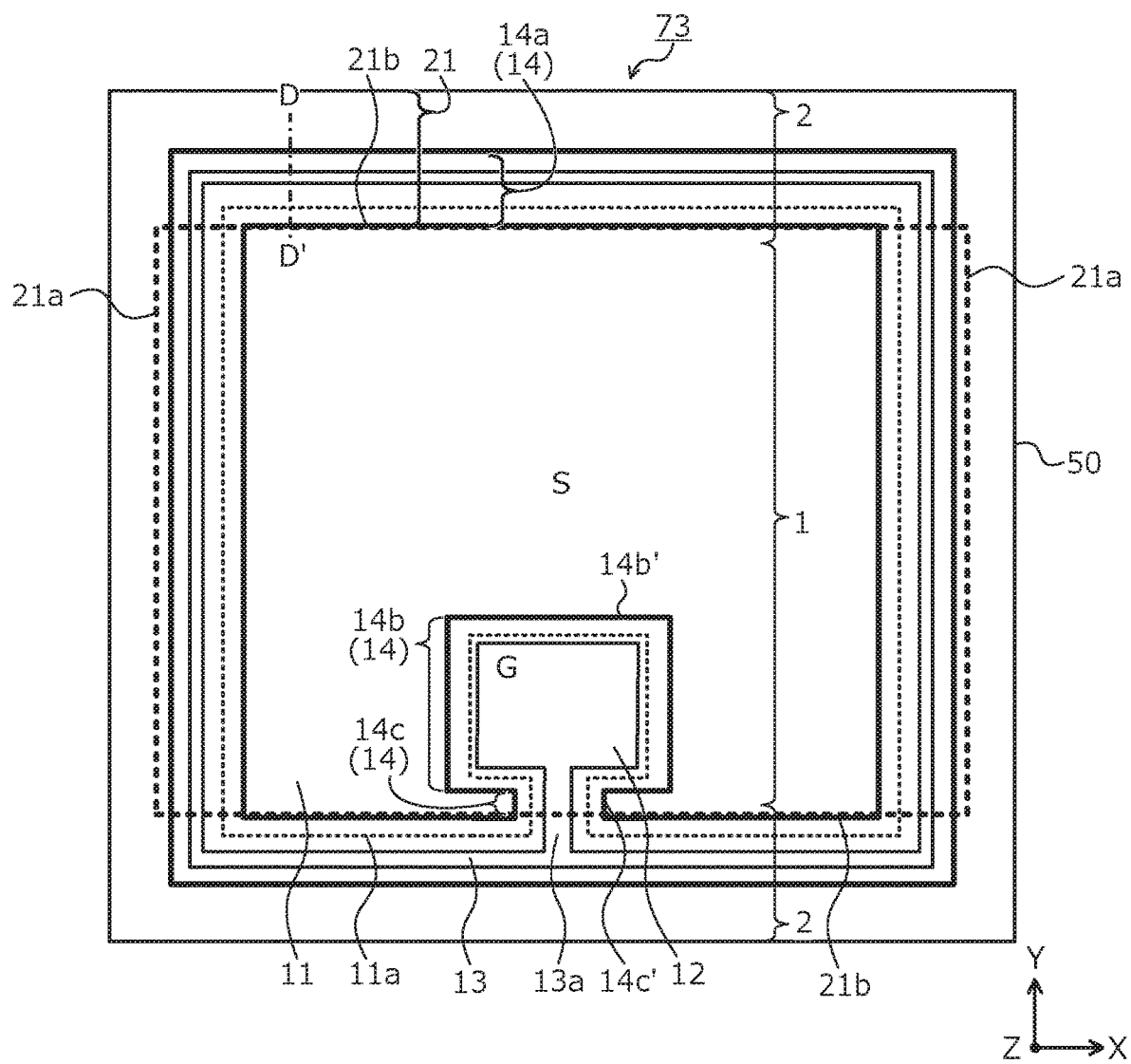
FIG. 7 is a plan view of a layout when a silicon carbide semiconductor device according to a fourth embodiment is viewed from the front surface of the semiconductor substrate.
Figure 8:
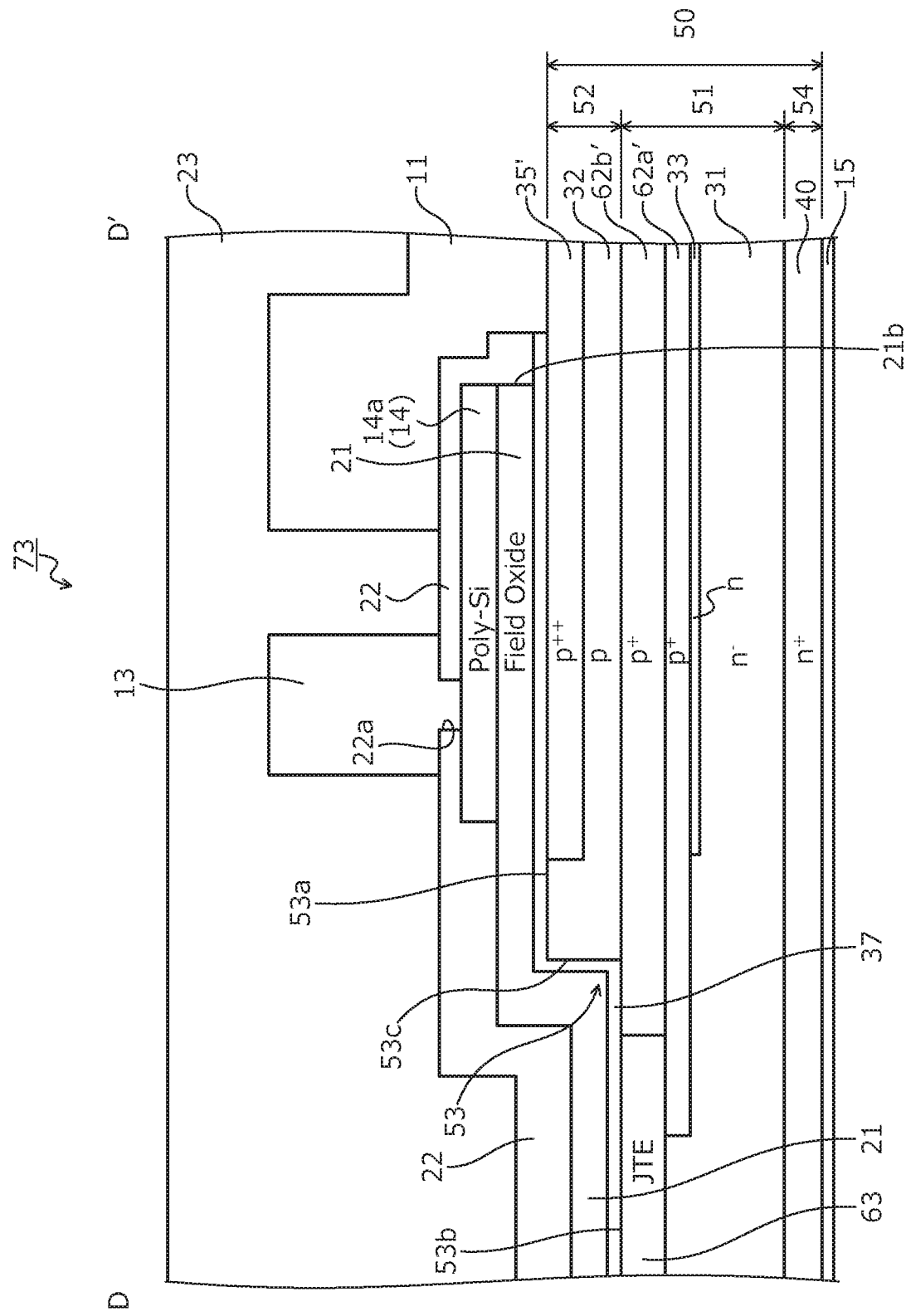
FIG. 8 is a cross-sectional view of a structure along cutting line D-D' in FIG. 7.

A structure of a silicon carbide semiconductor device according to a fourth embodiment will be described. FIG. 7 is a plan view of a layout when the silicon carbide semiconductor device according to the fourth embodiment is viewed from the front surface of the semiconductor substrate. FIG. 8 is a cross-sectional view of a structure along cutting line D-D' in FIG. 7. A silicon carbide semiconductor device 73 according to the fourth embodiment differs from the silicon carbide semiconductor device 10 according to the first embodiment (refer to FIGS. 1 to 4) in that a chip-center-side edge 21b of the field oxide film 21 and parallel to the first direction X is at a same position as that of the chip-center-side edge 14a' of the first portion 14a of the poly-silicon layer 14.

In particular, the chip-center-side edge 21b of a part (part parallel to the first direction X) of the field oxide film 21, is moved along the second direction Y that is parallel to the front surface of the semiconductor substrate 50 and orthogonal to the first direction X, toward the chip center to a same position as a position of the chip-center-side edge 14a' of a part (part parallel to the first direction X) of the first portion 14a of the poly-silicon layer 14. Therefore, at the part of the first portion 14a of the poly-silicon layer 14 parallel to the first direction X, a step due to the field oxide film 21 does not occur at the surface of the first portion 14a of the poly-silicon layer 14. In FIG. 7, the chip-center-side edges 21a, 21b of the field oxide film 21 is depicted by a dashed line that is thicker than that for the perimeter 11a of the source pad 11.

In this manner, at the parts of the first portion 14a of the poly-silicon layer 14 parallel to the first direction X, the chip-center-side edge 21b of the parts of the field oxide film 21 parallel to the first direction X, may be closer to the chip center than is the first portion 14a of the poly-silicon layer 14 so that a step due to the field oxide film 21 does not occur at the surface of the first portion 14a of the poly-silicon layer 14. Therefore, the chip-center-side edge 21b of the parts of the field oxide film 21 parallel to the first direction X may be slightly closer to the chip center than is the chip-center-side edge 14a' of the parts of the first portion 14a of the poly-silicon layer 14 parallel to the first direction X.

On the other hand, a part of the first portion 14a of the poly-silicon layer 14 (i.e., a part thereof parallel to the second direction Y) is a part that opposes the ends of the trenches 36 in the depth direction Z. The chip-center-side edge 21a of a part of the field oxide film 21 (i.e., a part thereof parallel to the second direction Y), similarly to the first embodiment, is closer to the chip end than is the first portion 14a of the part of the poly-silicon layer 14 parallel to the second direction Y. Therefore, at the parts of the first portion 14a of the poly-silicon layer 14 parallel to the second direction Y, a step due to the field oxide film 21 does not occur at the surface of the first portion 14a of the poly-silicon layer 14.

In other words, at the gate metal layer 13, at a part thereof parallel to the first direction X, a 3-layer structure in which the gate insulating film 37, the field oxide film 21, and the first portion 14a of the poly-silicon layer 14 are sequentially stacked on the front surface of the semiconductor substrate 50 is directly beneath the gate metal layer 13. At the gate metal layer 13, at a part thereof parallel to the second direction Y, a 2-layer structure in which the gate insulating film 37 and the first portion 14a of the poly-silicon layer 14 are sequentially stacked on the front surface of the semiconductor substrate 50 is directly beneath the gate metal layer 13. Therefore, a total film thickness of the insulating films (37, 21) present between the front surface of the semiconductor substrate 50 and the poly-silicon layer 14 is thicker at the parts parallel to the first direction X as compared to the parts parallel to the second direction Y.

In this manner, when the positions of the chip-center-side edges 21a, 21b of the field oxide film 21 in the first and the second directions X, Y differ, at corner portions (four vertices of the semiconductor substrate 50 having a substantially rectangular planar shape) of the semiconductor substrate 50, a step due to the field oxide film 21 occurs at the surface of the first portion 14a of the poly-silicon layer 14. In addition, depending on arrangement of the gate pad 12, although a step due to the field oxide film 21 occurs at the surface of the third portion 14c of the poly-silicon layer 14, the degree of freedom in design regarding the arrangement of the field oxide film 21 increases.

At the second portion 14b of the poly-silicon layer 14, similarly to the first embodiment, the field oxide film 21 is not present directly beneath the second portion 14b of the poly-silicon layer 14 and therefore, no step due to the field oxide film 21 occurs at the surface of the second portion 14b of the poly-silicon layer 14.

As described above, according to the fourth embodiment, the position of the chip-center-side edge of the field oxide film is moved toward the chip center, to a same position as the position of the chip-center-side edge of the first portion of the poly-silicon layer, whereby no step due to the field oxide film occurs at the surface of the first portion of the poly-silicon layer and therefore, effects similar to those of the first embodiment may be obtained.

A structure of silicon carbide semiconductor devices according to a fifth embodiment will be described. FIGS. 9, 10, 11, and 12 are plan views of a layout when the silicon carbide semiconductor devices according to the fifth embodiment are viewed from the front surface of the semiconductor substrate. In FIGS. 9 to 12, the poly-silicon layer 14, the chip-center-side edges 21a, 21b of the field oxide film 21 (in FIG. 9, only the chip-center-side edge 21a), and the trenches 36 silicon carbide semiconductor devices 74, 75, 76, and 77 according to the fifth embodiment are schematically depicted, respectively, and other constituent parts are not depicted. Further, the chip-center-side edges 21a, 21b of the field oxide film 21 are indicated by a dashed line.

The silicon carbide semiconductor devices 74 to 77 according to the fifth embodiment represent position relationships between the poly-silicon layer 14 and the chip-center-side edges 21a, 21b of the field oxide film 21 (in FIG. 9, only the chip-center-side edge 21a) at four edges of the semiconductor substrate 50 having a substantially rectangular planar shape. At the respective four edges of the semiconductor substrate 50, the positional relationships between the poly-silicon layer 14 and the chip-center-side edges 21a, 21b of the field oxide film 21 are indicated by "fallback" at edges to which the first embodiment is applied and "forward" at edges to which the fourth embodiment is applied.

In other words, regarding the positional relationships between the poly-silicon layer 14 and the chip-center-side edges 21a, 21b of the field oxide film 21, "fallback" in a case when the first embodiment is applied is an instance where the chip-center-side edge 21a of the field oxide film 21 is positioned closer to the chip end than is the poly-silicon layer 14. "forward" in a case when the fourth embodiment is applied is an instance where in the second direction Y, the chip-center-side edge 21b of the field oxide film 21 is at a same position as that of the chip-center-side edge 14a' of the first portion 14a of the poly-silicon layer 14.

Figure 9:
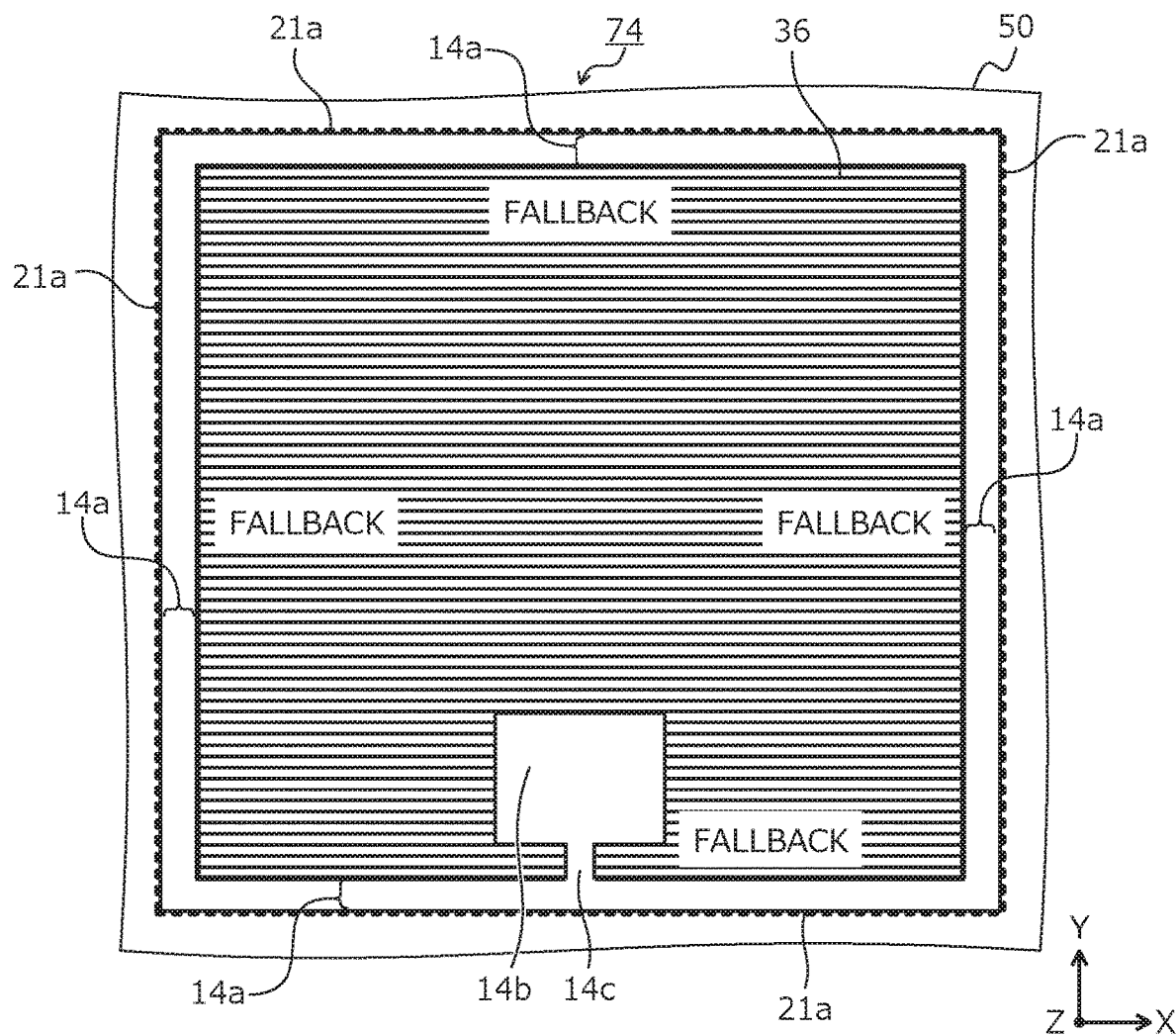
FIG. 9 is a plan view of a layout when silicon carbide semiconductor devices according to a fifth embodiment are viewed from the front surface of the semiconductor substrate.

In particular, the silicon carbide semiconductor device 74 according to the fifth embodiment and depicted in FIG. 9 is the silicon carbide semiconductor device 10 according to the first embodiment (refer to FIG. 1). In other words, at the four edges of the semiconductor substrate 50, the positional relationship between the poly-silicon layer 14 and the chip-center-side edge 21a of the field oxide film 21 is "fallback". While not depicted in FIG. 9, the poly-silicon layer 14 and the field oxide film 21 are disposed separated from each other as described above (similarly regarding "fallback" parts in FIGS. 10 to 12).

Figure 10:
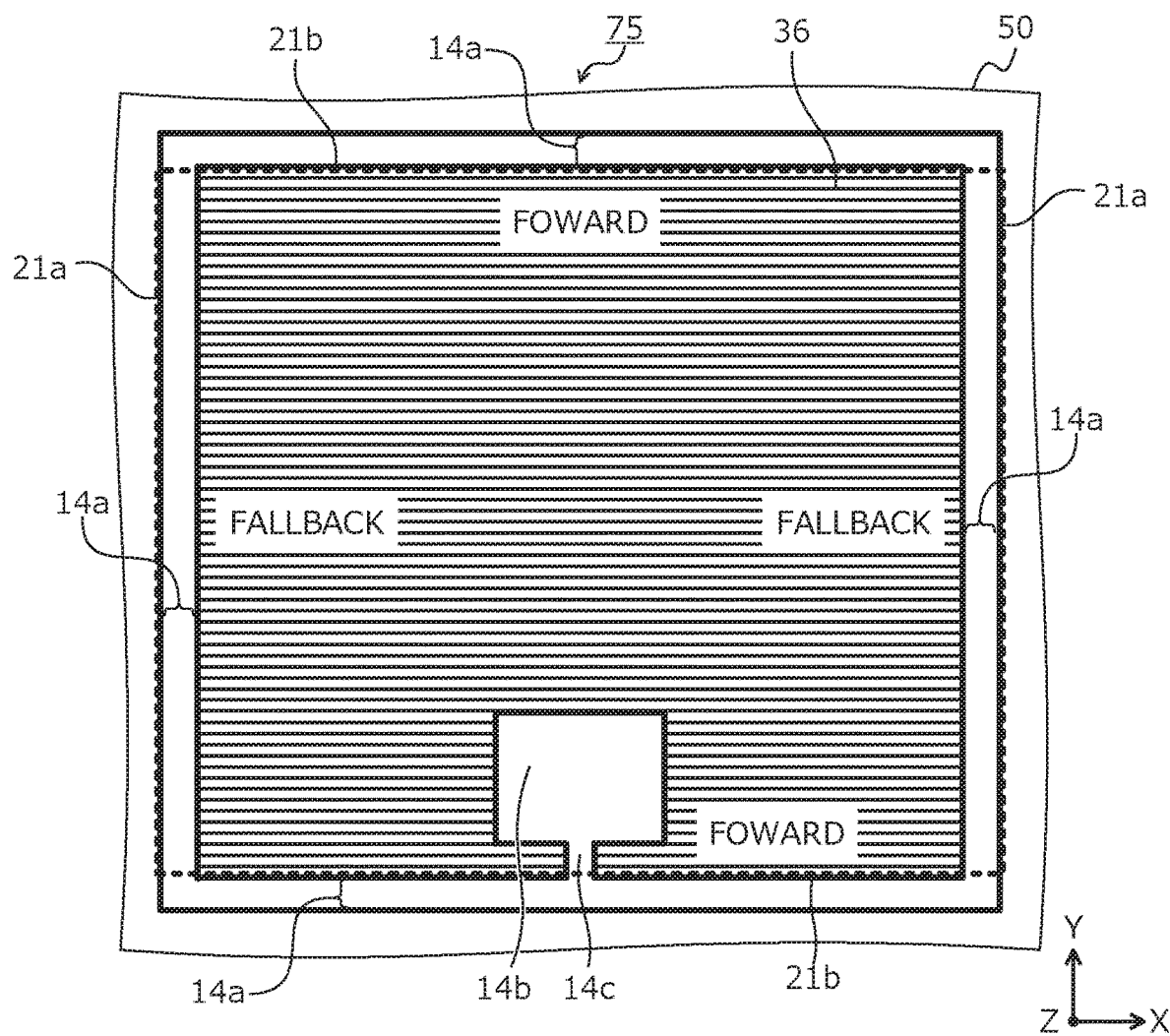
FIG. 10 is a plan view of a layout when silicon carbide semiconductor devices according to a fifth embodiment are viewed from the front surface of the semiconductor substrate.

The silicon carbide semiconductor device 75 according to the fifth embodiment and depicted in FIG. 10 is the silicon carbide semiconductor device 73 according to the fourth embodiment (refer to FIGS. 7 and 8). In other words, at two edges of the semiconductor substrate 50 parallel to the first direction X, the positional relationship between the poly-silicon layer 14 and the chip-center-side edge 21b of the field oxide film 21 is "forward". Further, at two edges of the semiconductor substrate 50 parallel to the second direction Y, the positional relationship between the poly-silicon layer 14 and the chip-center-side edge 21a of the field oxide film 21 is "fallback".

Figure 11:
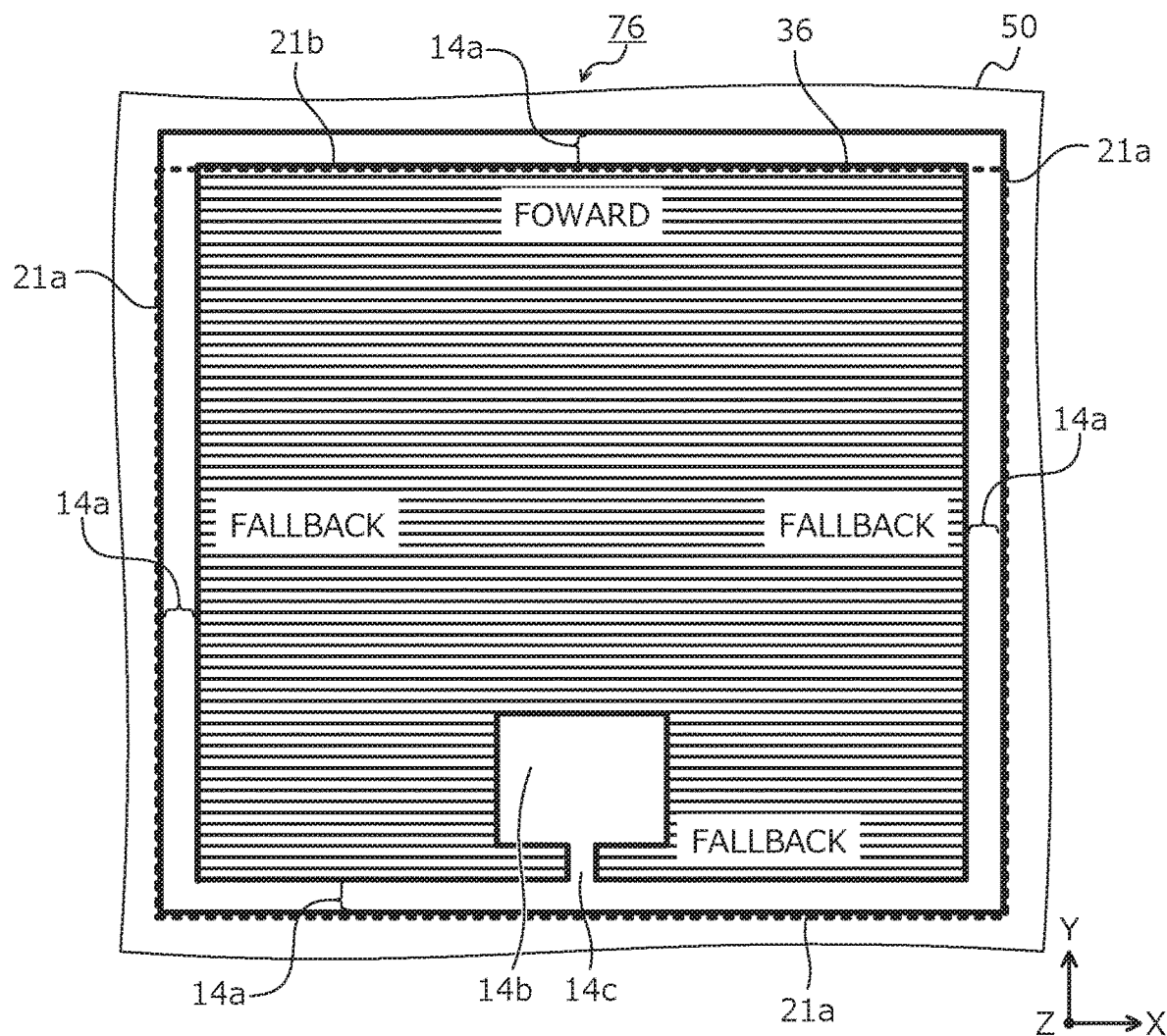
FIG. 11 is a plan view of a layout when silicon carbide semiconductor devices according to a fifth embodiment are viewed from the front surface of the semiconductor substrate.
Figure 12:
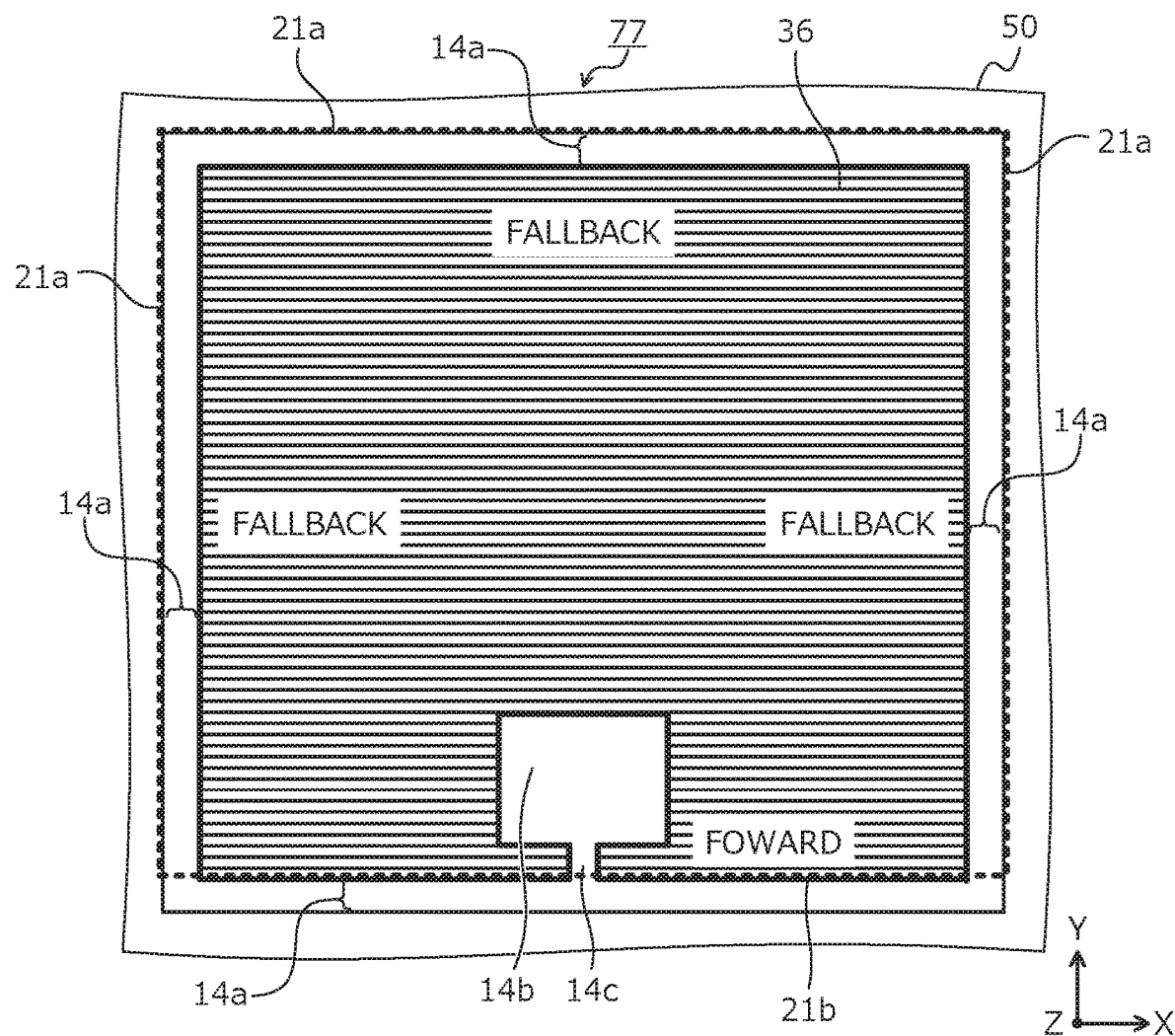
FIG. 12 is a plan view of a layout when silicon carbide semiconductor devices according to a fifth embodiment are viewed from the front surface of the semiconductor substrate.
Figure 13:
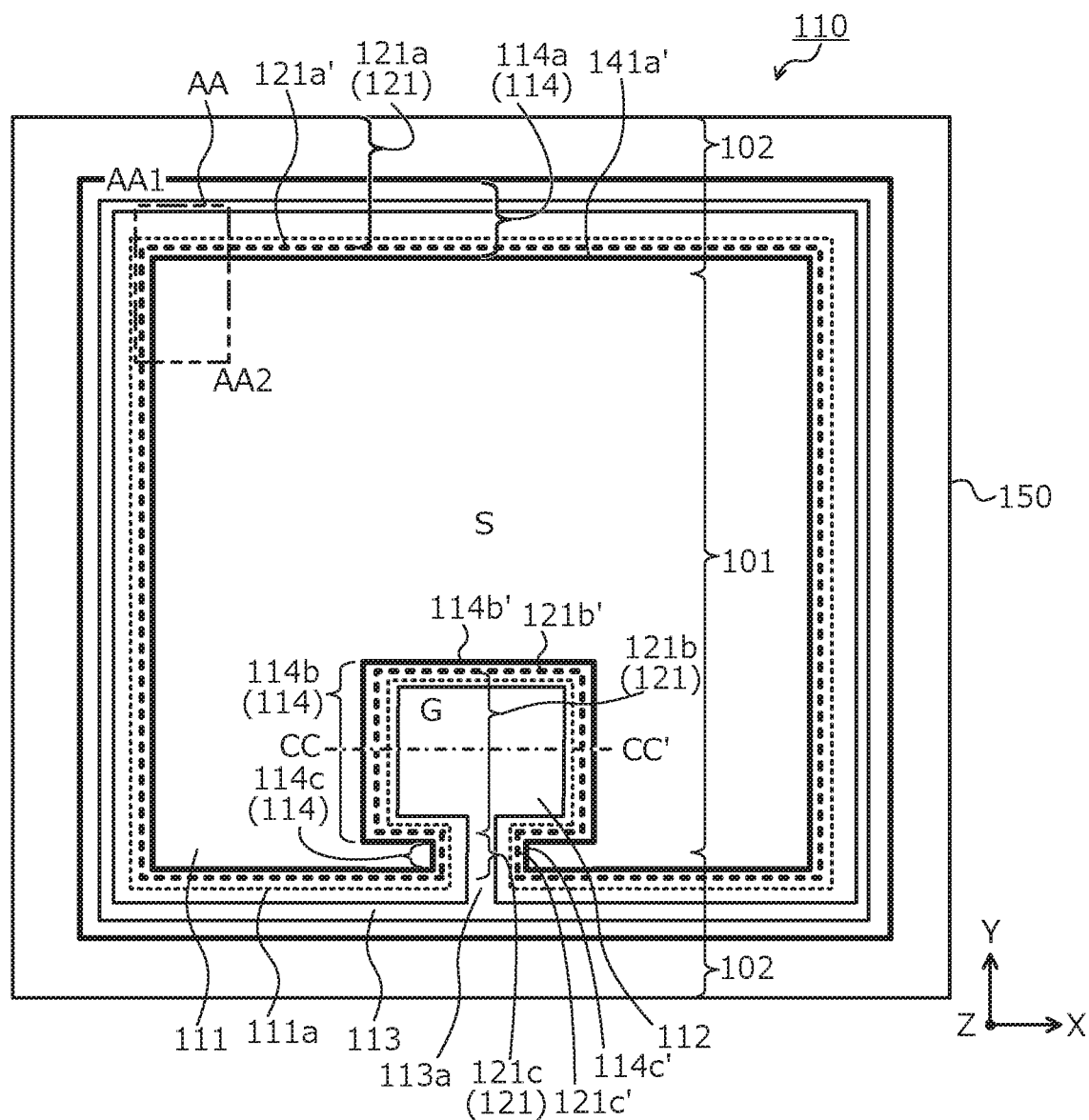
FIG. 13 is a plan view of a layout when a conventional silicon carbide semiconductor device is viewed from a front surface of a semiconductor substrate.

In the silicon carbide semiconductor devices 76, 77 according to the fifth embodiment and depicted in FIGS. 11 and 12, at any one of the two edges of the semiconductor substrate 50 parallel to the first direction X, the positional relationship between the poly-silicon layer 14 and the chip-center-side edge 21b of the field oxide film 21 is "forward". Further, at the other of the two edges of the semiconductor substrate 50 parallel to the first direction X and at the two edges parallel to the second direction Y, the positional relationship between the poly-silicon layer 14 and the chip-center-side edge 21a of the field oxide film 21 is "fallback".

Of the four edges of the semiconductor substrate 50, for the edges where the positional relationship between the poly-silicon layer 14 and the chip-center-side edge 21a of the field oxide film 21 is "fallback", the second embodiment may be applied instead of the first embodiment. In this case, in the silicon carbide semiconductor device 74 according to the fifth embodiment, the field oxide film 21 is not disposed. In the silicon carbide semiconductor device 75 according to the fifth embodiment, the field oxide film 21 is disposed only at the two edges of the semiconductor substrate 50 parallel to the first direction X. In the silicon carbide semiconductor devices 76, 77 according to the fifth embodiment, the field oxide film 21 is disposed only at one edge of the two edges of the semiconductor substrate 50 parallel to the first direction X.

Of the four edges of the semiconductor substrate 50, at least at an edge where the positional relationship between the poly-silicon layer 14 and the chip-center-side edge 21a of the field oxide film 21 is "fallback", the third embodiment may be applied instead of the first embodiment. In this case, of the four edges of the semiconductor substrate 50, at least at an edge where the positional relationship between the poly-silicon layer 14 and the chip-center-side edge 21a of the field oxide film 21 is "fallback", the mesa edge 53c' of the step 53 suffices to be inclined so as to form an obtuse angle with respect to the first face 53a of the front surface of the semiconductor substrate 50.

As described above, the first to the fourth embodiments are applicable to the fifth embodiment.

In the foregoing, the present invention is not limited to the embodiments described above and various modifications within a range not departing from the spirit of the invention are possible. For example, the present invention is further applicable to vertical semiconductor devices having a MOS gate such as a planar gate MOSFET, an insulated gate bipolar transistor (IGBT), etc. and has similar effects.

The silicon carbide semiconductor device according to the present invention achieves an effect in that a step due to the oxide film does not occur in the surface of the poly-silicon layer, whereby electric field concentration near inner peripheral edges of the poly-silicon layer does not occur, thereby enabling dielectric breakdown to be prevented.

As described, the silicon carbide semiconductor device according to the present invention is useful for vertical semiconductor devices having a MOS gate and is particularly suitable for a vertical MOSFET having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
an active region;
a termination region provided at a periphery of the active region;
a semiconductor substrate containing silicon carbide;
an insulated gate structure provided at a front surface side of the semiconductor substrate, the insulated gate structure being provided in the active region and including a metal oxide semiconductor field effect transistor formed by a 3-layer structure of a metal, an oxide film and a semiconductor, the semiconductor substrate including
 a first-conductivity-type semiconductor layer, configuring a drift region of the metal oxide semiconductor field effect transistor, and
 a second-conductivity-type semiconductor layer provided at the front surface side of the semiconductor substrate, and on the first-conductivity-type semiconductor layer, the second-conductivity-type semiconductor layer configuring a base region of the metal oxide semiconductor field effect transistor;
a trench provided at the front surface side of the semiconductor substrate and extending in a first direction parallel to a front surface of the semiconductor substrate;
an insulating film provided at the front surface side of the semiconductor substrate,
a gate electrode of the metal oxide semiconductor field effect transistor provided in the trench via the insulating film;
a second-conductivity-type high-concentration region, provided in a surface region at the front surface side of the semiconductor substrate in the termination region, the second-conductivity-type high-concentration region forming a second-conductivity-type junction with the second-conductivity-type semiconductor layer, the second-conductivity-type high-concentration region having an impurity concentration higher than an impurity concentration of the second-conductivity-type semiconductor layer;
a first gate poly-silicon layer provided on the front surface of the semiconductor substrate in the termination region via the insulating film, and facing the second-conductivity-type high-concentration region via the insulating film in a depth direction, the first gate poly-silicon layer surrounding the periphery of the active region, and having a rectangular ring shape, the first gate poly-silicon layer being electrically connected to the gate electrode at an end of the trench; and
a field oxide film provided on the front surface of the semiconductor substrate in the termination region via the insulating film, the field oxide film surrounding a periphery of the first gate poly-silicon layer, and having a rectangular ring shape with four side parts, two of which extend in the first direction and the other two of which extend in a second direction orthogonal to the first direction, wherein
at least one side part of the field oxide film that extends in the second direction is disposed from an outer periphery of the termination region toward the active region in the first direction, a closest edge to the active region of the at least one side part is located at a position further from the active region than is a position of a furthest edge from the active region of the first gate poly-silicon layer.

2. The silicon carbide semiconductor device according to claim 1, wherein
at least one side part of the field oxide film that extends in the first direction is disposed from the outer periphery of the termination region toward the active region in the second direction, a closest edge to the active region of the at least one side part extending in the first direction is located at a same position as a closest edge from the active region of the first gate poly-silicon layer.

3. The silicon carbide semiconductor device according to claim 2, wherein
the at least one side part includes the two side parts of the field oxide film that extend in the first direction and are each disposed from the outer periphery of the termination region toward the active region in the second direction, a closest edge to the active region of each of the two side parts extending in the first direction is located to the same position as the closest edge from the active region of the first gate poly-silicon layer.

4. The silicon carbide semiconductor device according to claim 1, wherein
a furthest edge from the active region of the second-conductivity-type high-concentration region is located at a position closer to the active region than is a position of a furthest edge from the active region of the second-conductivity-type semiconductor layer, and
in at least two side parts of the field oxide film that extend in the second direction, a closest edge to the active region of each of the two side parts extending in the second direction is located on the second-conductivity-type semiconductor layer via the insulating film in the depth direction, and is located further from the active region than is a position of the second-conductivity-type junction.

5. The silicon carbide semiconductor device according to claim 1, wherein
an outer side edge of the first gate poly-silicon layer is positioned within a plane area of the second-conductivity-type high-concentration region.

6. The silicon carbide semiconductor device according to claim 1, wherein
an entire surface of the first gate poly-silicon layer is flat.

7. The silicon carbide semiconductor device according to claim 1, further comprising:
a second gate poly-silicon layer connected to the first gate poly-silicon layer, and being provided on the front surface of the semiconductor substrate via the insulating film in the active region; and a gate pad provided on the second gate poly-silicon layer via an interlayer insulating film, and being electrically connected to the second gate poly-silicon layer, wherein a region between the front surface of the semiconductor substrate and the second gate poly-silicon layer is free of the field oxide film.

8. The silicon carbide semiconductor device according to claim 1, wherein the insulating film is a high temperature oxide film or a thermal oxide film, the field oxide film is a silicon oxide film, and field oxide film having a thickness greater than a thickness of the insulating film.

* * * * *